(12) United States Patent
Chang et al.

(10) Patent No.: US 12,008,302 B2
(45) Date of Patent: *Jun. 11, 2024

(54) INTEGRATED CIRCUIT WITH THICKER METAL LINES ON LOWER METALLIZATION LAYER

(71) Applicant: TAIWAN SEMICONDUCTOR MANUFACTURING CO., LTD., Hsinchu (TW)

(72) Inventors: Kuang-Hung Chang, Hsinchu (TW); Yuan-Te Hou, Hsinchu (TW); Chung-Hsing Wang, Hsinchu County (TW); Yung-Chin Hou, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/173,731

(22) Filed: Feb. 23, 2023

(65) Prior Publication Data

US 2023/0205966 A1    Jun. 29, 2023

Related U.S. Application Data

(63) Continuation of application No. 17/404,511, filed on Aug. 17, 2021, now Pat. No. 11,593,546, which is a
(Continued)

(51) Int. Cl.
*H01L 23/528* (2006.01)
*G06F 30/20* (2020.01)
(Continued)

(52) U.S. Cl.
CPC ............ *G06F 30/392* (2020.01); *G06F 30/20* (2020.01); *G06F 30/327* (2020.01);
(Continued)

(58) Field of Classification Search
CPC ...... G06F 30/392; G06F 30/394; G06F 30/20; G06F 30/327; G06F 30/337;
(Continued)

(56) References Cited

U.S. PATENT DOCUMENTS 6,001,733 A * 12/1999 Huang .............. H01L 21/76808
257/E21.583
6,337,517 B1    1/2002 Ohta et al.
(Continued)

FOREIGN PATENT DOCUMENTS

CN    107273623 A    10/2017
TW    201917852 A    5/2019
(Continued)

OTHER PUBLICATIONS

Nn7608878, "Control Algorithm for Forming Zero Overlap Via Holes", IBM TDB, Aug. 1, 1976, 2 pages. (Year: 1976).*
(Continued)

*Primary Examiner* — Phallaka Kik
(74) *Attorney, Agent, or Firm* — Maschoff Brennan

(57) ABSTRACT

An IC structure includes first, second, third, and fourth transistors on a substrate, a first net and a second net. The first net includes a plurality of first metal lines routed on a first metallization layer, and a plurality of first metal vias electrically connecting the plurality of first metal lines to the first and second transistors. The second net includes a plurality of second metal lines routed on a second metallization layer, and a plurality of second metal vias electrically connecting the plurality of second metal lines to the third and fourth transistors. A count of the first metal vias of the first net is less than a count of the second metal vias of the second net, and a line height of the first metal line of the first net is greater than a line height of the second metal line of the second net.

20 Claims, 27 Drawing Sheets

Related U.S. Application Data continuation of application No. 16/900,684, filed on Jun. 12, 2020, now Pat. No. 11,113,443.

(51) Int. Cl.
  *G06F 30/327* (2020.01)
  *G06F 30/337* (2020.01)
  *G06F 30/373* (2020.01)
  *G06F 30/392* (2020.01)
  *G06F 30/394* (2020.01)
  *G06F 30/398* (2020.01)
  *H01L 27/00* (2006.01)
  *H01L 27/088* (2006.01)

(52) U.S. Cl.
  CPC .......... *G06F 30/394* (2020.01); *H01L 23/528* (2013.01); *H01L 27/0886* (2013.01); *G06F 30/337* (2020.01); *G06F 30/373* (2020.01); *G06F 30/398* (2020.01)

(58) Field of Classification Search
  CPC ... G06F 30/373; G06F 30/398; H01L 23/528; H01L 27/0886
  USPC ..... 716/122, 129, 130, 132; 703/15; 326/41, 326/47, 101
  See application file for complete search history.

(56) References Cited

U.S. PATENT DOCUMENTS

| | | | |
|---|---|---|---|
| 7,023,739 B2 | 4/2006 | Chen et al. | |
| 7,076,750 B1* | 7/2006 | Lukanc | G06F 30/392 716/55 |
| 7,119,383 B2 | 10/2006 | Ohayashi et al. | |
| 7,406,645 B2* | 7/2008 | Nozuyama | G01R 31/31835 714/738 |
| 8,461,035 B1* | 6/2013 | Cronquist | H01L 29/785 438/599 |
| 8,891,280 B2 | 11/2014 | Castro et al. | |
| 8,946,884 B2 | 2/2015 | Kwon et al. | |
| 9,087,171 B2 | 7/2015 | Kitaura | |
| 9,293,366 B2 | 3/2016 | Lin et al. | |
| 9,406,738 B2 | 8/2016 | Kireev et al. | |
| 9,484,973 B1 | 11/2016 | Carroll et al. | |
| 9,620,510 B2 | 4/2017 | Liaw | |
| 9,634,243 B1* | 4/2017 | Chuang | H10B 61/22 |
| 9,659,882 B2 | 5/2017 | d-Abreu | |
| 9,711,407 B2 | 7/2017 | Or-Bach et al. | |
| 9,755,000 B2 | 9/2017 | Ikedo | |
| 9,911,697 B2 | 3/2018 | Chen et al. | |
| 10,074,641 B2 | 9/2018 | Chao et al. | |
| 10,388,568 B2 | 8/2019 | Or-Bach et al. | |
| 10,671,688 B2 | 6/2020 | Nakashima | |
| 10,756,114 B2 | 8/2020 | Liaw | |
| 10,963,609 B2* | 3/2021 | Lin | G06F 30/398 |
| 11,113,443 B1* | 9/2021 | Chang | H01L 23/5226 |
| 11,256,846 B2 | 2/2022 | Kim | |
| 11,593,546 B2* | 2/2023 | Chang | G06F 30/327 |
| 2005/0242435 A1* | 11/2005 | Werking | H01L 21/76801 257/737 |
| 2007/0123009 A1* | 5/2007 | Richter | H01L 23/5226 438/479 |
| 2007/0178691 A1* | 8/2007 | Richter | H01L 23/544 257/E23.179 |
| 2007/0278693 A1* | 12/2007 | Lehr | H01L 21/76808 438/700 |
| 2008/0120586 A1* | 5/2008 | Hoerold | G06F 30/39 716/55 |
| 2009/0219669 A1* | 9/2009 | Lai | H01G 4/228 361/306.3 |
| 2011/0254576 A1* | 10/2011 | Cho | G01R 31/2846 324/756.01 |
| 2014/0096101 A1 | 4/2014 | Kitaura | |
| 2016/0211223 A1* | 7/2016 | d'Abreu | H01L 21/302 |
| 2016/0276259 A1* | 9/2016 | Kunimoto | H01L 21/563 |
| 2016/0314238 A1* | 10/2016 | Yuan | G06F 30/398 |
| 2017/0040707 A1* | 2/2017 | Wu | H01Q 15/0053 |
| 2017/0220725 A1* | 8/2017 | Lin | G06F 30/367 |
| 2017/0228487 A1* | 8/2017 | Hellner | G06F 30/394 |
| 2018/0374895 A1* | 12/2018 | Hsu | H10N 50/01 |
| 2019/0094303 A1* | 3/2019 | Patidar | G06F 30/398 |
| 2019/0122986 A1 | 4/2019 | Yang et al. | |
| 2019/0155981 A1* | 5/2019 | Biswas | H01L 27/0207 |
| 2019/0165041 A1* | 5/2019 | Chuang | H10B 61/22 |
| 2019/0332739 A1* | 10/2019 | Biswas | H01L 23/5286 |
| 2020/0006424 A1 | 1/2020 | Sato et al. | |
| 2020/0019668 A1* | 1/2020 | Chang | G06F 30/394 |
| 2020/0044049 A1* | 2/2020 | Yeoh | H01L 23/5329 |
| 2020/0082047 A1 | 3/2020 | Shao et al. | |
| 2021/0200930 A1* | 7/2021 | Lin | G06F 30/394 |
| 2021/0390240 A1* | 12/2021 | Chang | G06F 30/327 |

FOREIGN PATENT DOCUMENTS

| | | |
|---|---|---|
| TW | 201926555 A | 7/2019 |
| WO | 2021000372 A1 | 1/2021 |
| WO | WO-2021000372 A1 * | 1/2021 ........... G11C 11/161 |

OTHER PUBLICATIONS

Ochiai et al., Japanese Patent Document No. JP-11040741-A, Published Feb. 12, 1999, 4 pages, including abstract and 1 drawing. (Year: 1999).*

* cited by examiner

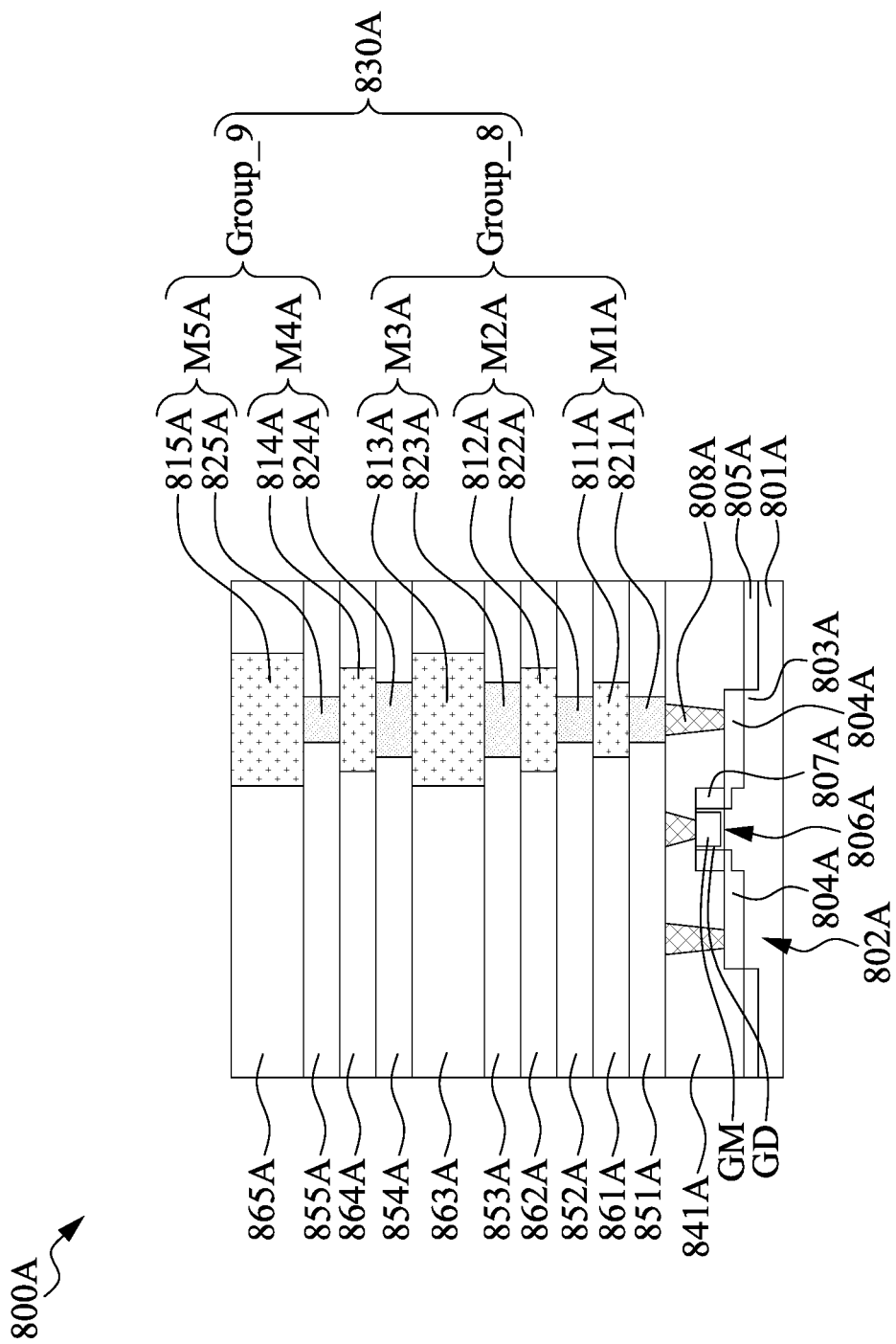

INTEGRATED CIRCUIT WITH THICKER METAL LINES ON LOWER METALLIZATION LAYER

PRIORITY CLAIM AND CROSS-REFERENCE

The present application is a Continuation Application of the U.S. application Ser. No. 17/404,511, filed Aug. 17, 2021, now U.S. Pat. No. 11,593,546, issued Feb. 28, 2023, which is a Continuation Application of the U.S. application Ser. No. 16/900,684, filed Jun. 12, 2020, now U.S. Pat. No. 11,113,443, issued Sep. 7, 2021, all of which are herein incorporated by reference in their entirety.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8C is a cross-sectional view of an IC structure fabricated using the layout of FIG. 8A according to some embodiments of the present disclosure.

DETAILED DESCRIPTION

Figure 1:
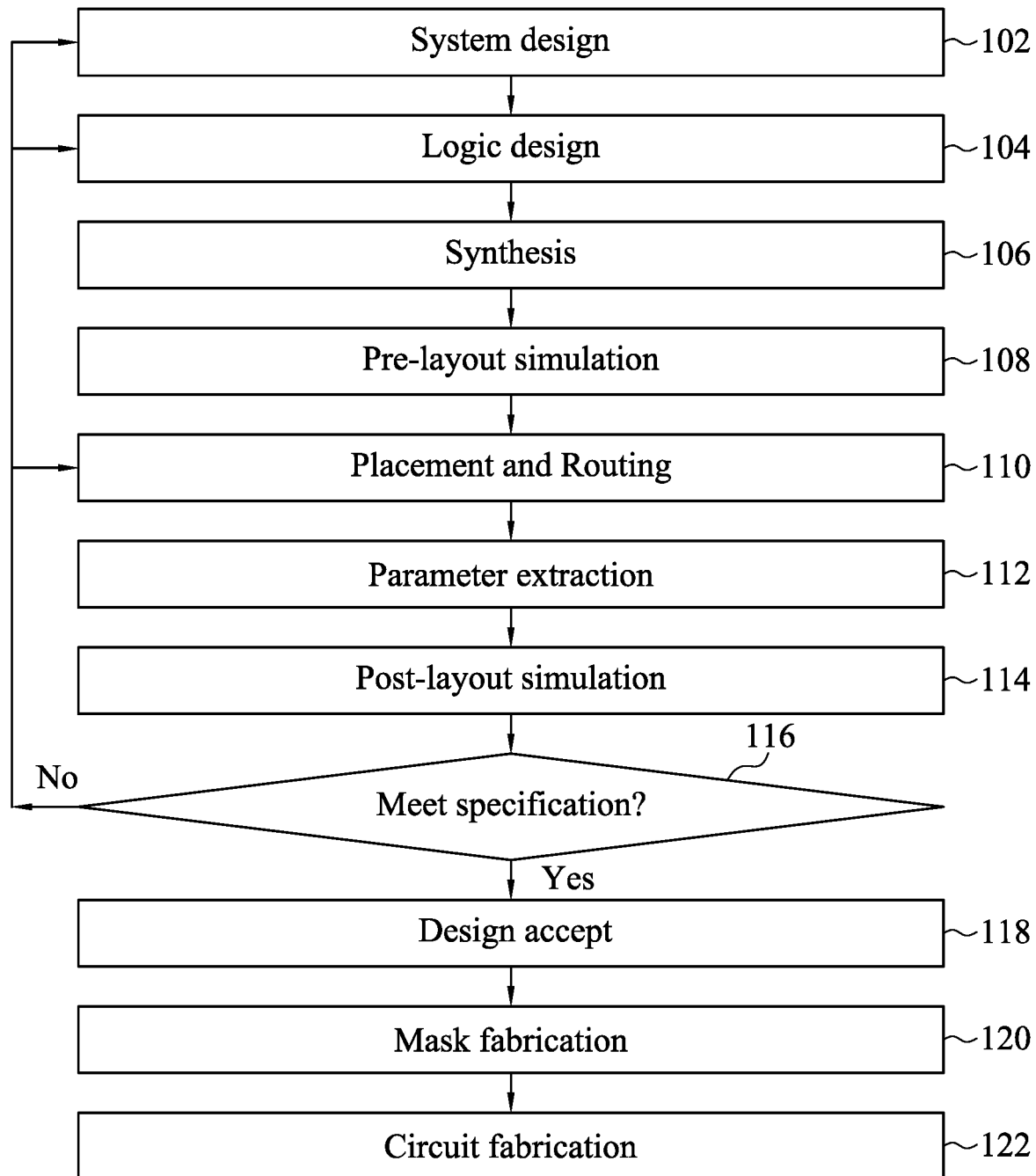
FIG. 1 is a flowchart of an exemplary fabricating flow for fabricating ICs in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits (ICs) include a number of devices such as transistors, resistors and capacitors. These devices are initially isolated from each other, and are later interconnected with each other using metal lines formed in multiple metallization layers overlying the circuit devices. The metal lines connect individual devices to make up a cell, including supplying power to the cell, and connect cells to each other globally (i.e., on a chip-level) to implement the intended function of the ICs. Cell placement and routing of metal lines are part of an overall design process for the ICs.

In IC manufacturing, a device scaling-down process, or "shrink," occurs as advanced technology nodes (e.g., 10, 7, 5, 3 nm technology nodes) are developed. An integrated circuit, or a layout thereof, is scaled from a larger size to a smaller size during the scaling-down or shrink process. Integrated circuits and IC layouts are scaled in order to fit more devices onto a substrate for increased performance in successive generations of semiconductor devices. Integrated circuits and IC layouts are scaled in order to decrease power consumption and to accommodate smaller dimensions of devices in the integrated circuit.

When shrinking the devices in the integrated circuit, the interconnection metal lines used to connect the devices also shrink in at least one dimension. Thus, a device shrink, in some embodiments, is accompanied by a decrease in line width for interconnection metal lines. However, decrease in the line width results in an increase in resistance of a net (i.e., a conductive path between nodes or terminals of semiconductor devices that collectively form electrical circuits) formed from metal lines, which in turn would degrade IC performance (e.g., RC delay). As a result, metal lines in some upper metallization layers are designed as thicker lines (i.e., having greater line width) as compared to those thinner lines (i.e., having smaller line width) in lower metallization layers, which in turn alleviates RC delay impacts resulting from the thinner lines. In order to reduce resistance of long nets, automatic placement and routing (APR) operation may route the long nets on the thicker metal lines. However, routing the long nets on the thicker metal lines on the upper metallization layer is accompanied by more vias used to reach the upper metallization layer, which in turn degrades the benefit of thicker lines as discussed above. Embodiments of the present disclosure describe a method of designing and fabricating thicker metal lines in a lower metallization layer, which in turn allows the router to route long nets on a lower metallization layer, thus reducing the resistance in the long nets.

FIG. 1 is a flowchart of an exemplary fabricating flow 100 for fabricating ICs in accordance with some embodiments. The fabricating flow 100 utilizes at least one electronic design automation (EDA) tool and at least one fabrication tool to carry out one or more operations in the flow 100. In some embodiments, operations in this flow 100 may be performed by different entities such as a design house, a mask house, and/or a semiconductor device manufacturer/fabricator ("fab"), that interact with one another in design, development, and manufacturing cycles and/or services related to ICs. In some embodiments, two or more of design house, mask house and fab is owned by a single larger company, and thus the flow 100 may be performed by a single entity. In some embodiments, two or more of design house, mask house and fab coexist in a common facility and thus can use common resources to perform the flow 100. The flow 100 illustrated in FIG. 1 is exemplary. Modifications to stages in the flow 100, such as change of order for the stages, partition of the stages, and deletion or addition of stages, are within the contemplated scope of the present disclosure.

Initially, at the system design stage 102 of the flow 100, a systematic architecture for the chip of interest is provided with a high-level description. At stage 102, the chip functions along with performance requirements are determined according to a design specification. The chip functions are represented by respective schematic functional modules or blocks. In addition, an optimization or performance trade-off may be sought to achieve the design specification at acceptable levels of cost and power.

At the logic design stage 104 of the flow 100, the functional modules or blocks are described in a register transfer level (RTL) using a hardware description language. Commercially available language tools are generally used, such as Verilog or VHDL. In some embodiments, a preliminary functionality check is performed at the logic design stage 104 to verify if the implemented functions conform to the specification set forth in the system design stage 102.

Subsequently, at the synthesis stage 106 of the flow 100, the modules in the RTL descriptions are converted into a netlist data where the circuit structure, e.g., logic gates and registers, of each function module are established. In some embodiments, technology mapping of logic gates and registers to available cells in the standard cell libraries are conducted. Further, the netlist data is offered to describe the functional relationship of the chip at a gate level. In some embodiments, the netlist data is transformed from the gate-level view to a transistor-level view.

Subsequently, the gate-level netlist data is verified at the pre-layout simulation stage 108. During the verification process of stage 108, if some of the functions fail the verification in the simulation, the flow 100 may be paused temporarily or may go back to stage 102 or 104 for further modification. After the pre-layout simulation stage 108, the chip design has passed a preliminary verification and the front-end design process is completed. Next, a back-end physical design process follows.

At the placement and routing stage 110, a physical architecture representing the chips determined during the front-end process is implemented. The layout development involves a placement operation and a routing operation in sequence. Detailed structure and associated geometry for the devices (e.g., transistors) of the IC chips are determined in the placement operation. Interconnects among different devices are routed subsequent to the placement operation. Both placement and routing operations are performed to meet a design rule check (DRC) deck so that the manufacturing requirements of the chips are fulfilled. In some embodiments, a clock tree synthesis operation is performed at the placement and routing stage for a digital circuit in which clock generators and circuits are incorporated into the design. In some embodiments, a post-routing operation is performed subsequent to the preliminary routing operation in order to fix timing issues with the preliminary routing operation. Once the placement and routing stage 110 is completed, a placed-and-routed layout is created and a netlist along with data on placement and routing is generated accordingly.

At the parameter extraction stage 112 of the flow 100, a layout parameter extraction (LPE) operation is conducted to derive layout-dependent parameters, such as parasitic resistance and capacitance, resulting from the layout developed in the placement and routing stage 110. Subsequently, a post-layout netlist data, which includes the layout-dependent parameters, is generated.

At the post-layout simulation stage 114 of the flow 100, a physical verification may be performed taking into consideration the parameters acquired in previous stages. A simulation of transistor-level behavior is conducted to examine whether the chip performance meets the required system specifications. In some embodiments, the post-layout simulation is performed to minimize possibilities of electrical issues or layout difficulties during the chip manufacturing process.

Next, in the stage 116 of the flow 100, it is determined whether the post-layout netlist meets the design specifications. If affirmative, the circuit design is accepted at stage 118 and then signed off accordingly. The IC chips are manufactured according to the accepted post-layout netlist. However, if the result of the post-layout simulation is unfavorable, the flow 100 loops back to previous stages for tuning functionalities or structures. For example, the flow 100 may loop back to the placement and routing stage 110 where the layout is re-developed to fix issues from a physical perspective. Alternatively, the flow 100 may retreat to an earlier stage 102 or 104 to recast the chip design from a functional level in case the problems cannot be resolved within the back-end physical design process.

At the mask fabrication stage 120 of the flow 100, one or more photomasks are fabricated based on the post-layout netlist accepted at the stage 118. For example, a mask house uses the layout that is accepted at the stage 118 to manufacture one or more photomasks (interchangeably referred to as reticles) to be used for fabricating the various layers of IC chips according to layout. In some embodiments, the mask house performs mask data preparation, where the design layout is translated into a representative data file ("RDF"). Mask data preparation provides the RDF to a mask writer. A mask writer converts the RDF to an image on a substrate to form a photomask. A photomask is a patterned mask used to allow light within a particular wavelength range to pass through while blocking light outside the particular wavelength range in order to form a pattern of features on a light-sensitive layer, for example, a photoresist layer on a wafer. In some embodiments, a multi-layer layout netlist may use multiple photomasks in which the feature pattern in each layer is established in the corresponding photomask. As a result, geometries of the layout features on the photomasks are transferred to the light-sensitive layers through photolithography operations in following IC fabrication operation 122.

At the IC fabrication operation 122 of the flow 100, integrated circuits are fabricated on a wafer using the photomasks fabricated in the mask fabrication operation 120. The fabrication may involve various semiconductor manufacturing operations, such as photolithography, etching, deposition, and thermal diffusion operations. In some embodiments, a testing operation may be utilized in an intermediate or final phase of IC fabrication operation 122 to ensure physical and functional integrity of the fabricated ICs. A singulation operation is used to separate the wafer into individual IC chips (or dies). The fabrication of the IC chips is thus completed.

Figure 2:
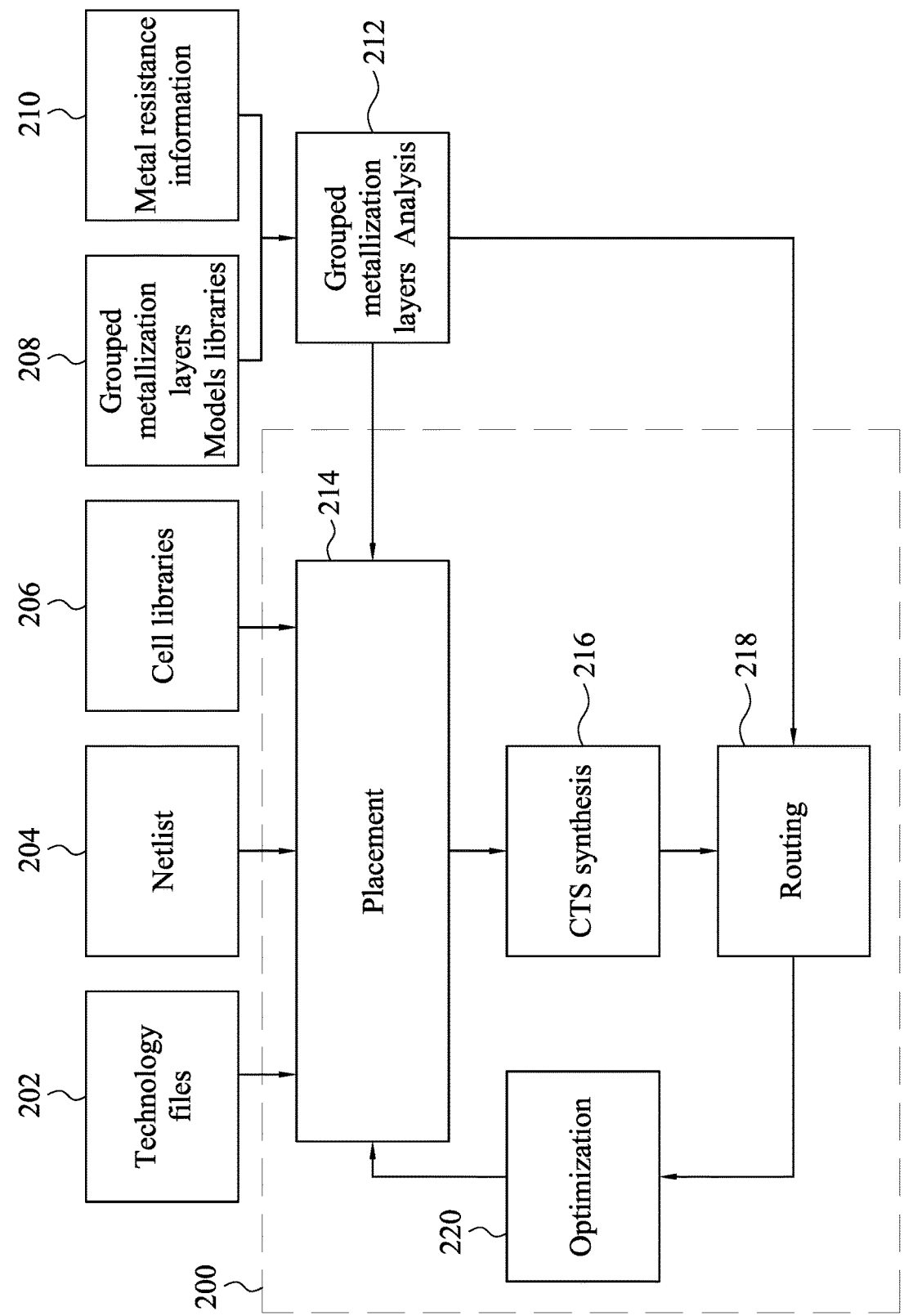
FIG. 2 is a schematic diagram of an automatic placement and routing (APR) function in accordance with some embodiments.

FIG. 2 is a schematic diagram of an automatic placement and routing (APR) function 200 in accordance with some embodiments. The APR function 200 may correspond to the placement and routing operation of stage 110 in FIG. 1. Operations in the APR function illustrated in FIG. 2 are exemplary. Modifications to the operations, such as change of order for the operations, partition of the operations, and deletion or addition of operations, are within the contemplated scope of the present disclosure.

Initially, technology files 202 related to the semiconductor fabricating process, netlist data 204 and cell libraries 206 are received or provided for the APR function 200. A plurality of models of grouped metallization layers are defined, e.g., in the APR library/database 208 to expand or supplement design rules, thus building libraries of models of grouped metallization layers for the APR function 200. Metal resistance information 210 is received or provided for analyzing the models of grouped metallization layers. In operation 212, the models of grouped metallization layers are analyzed based on the metal resistance information 210. The analysis includes calculating, for example, resistance, capacitance and/or signal delay resulting from each model of grouped metallization layers based on the metal resistance information 210.

The APR function 200 includes a placement operation 214 to place cells in a layout based on the technology files 202, the netlist 204, the standard cell libraries 206, and/or the analysis result of models of grouped metallization layers generated from operation 212. By way of example and not limitation, in the placement operation 214, mapped cells of logic gates and registers of the circuit blocks are placed at specific locations in a layout.

The APR function 200 further includes performing a clock tree synthesis (CTS) operation 216 upon the layout after the placement operation 214. During the CTS operation 216, clock signal generators are placed in the layout and a timing analysis is performed on nodes across the layout to ensure the timing distribution meets the specification requirements. In some embodiments, a CTS tool may automatically designs a clock tree for distributing a clock signal to a plurality of clocked devices such as flip-flops, registers, and/or latches that change state in response to clock signal pulses. The CTS tool may lay out the conductors forming the clock tree in a way that tries to equalize the distance the clock signal travelling to each clocked device from an IC input terminal receiving the clock signal from an external source. The CTS tool may place buffers or amplifiers at branch points of the tree to drive all of the buffers or clocked devices downstream of the branch point. Based on an estimate of the signal path delay in each branch of the clock tree, the CTS tool may balance the clock tree by inserting addition buffers in selected branches of the clock tree to adjust the path delays within those branches to ensure that the clock tree will deliver each clock signal pulse to every clocked device at nearly the same time.

The APR function 200 further includes a routing operation 218 performed to route metal lines to connect devices (e.g., transistors) in the cells based on the technology files 202, the netlist 204, the standard cell libraries 206, and/or the analysis results of models of grouped metallization layers generated from operation 212. For example, in the routing operation 218, one or more models of grouped metallization layers are selected from the libraries 208, so as to stack metallization routing layers over the devices (e.g., transistors) in the layout.

Figure 3A:
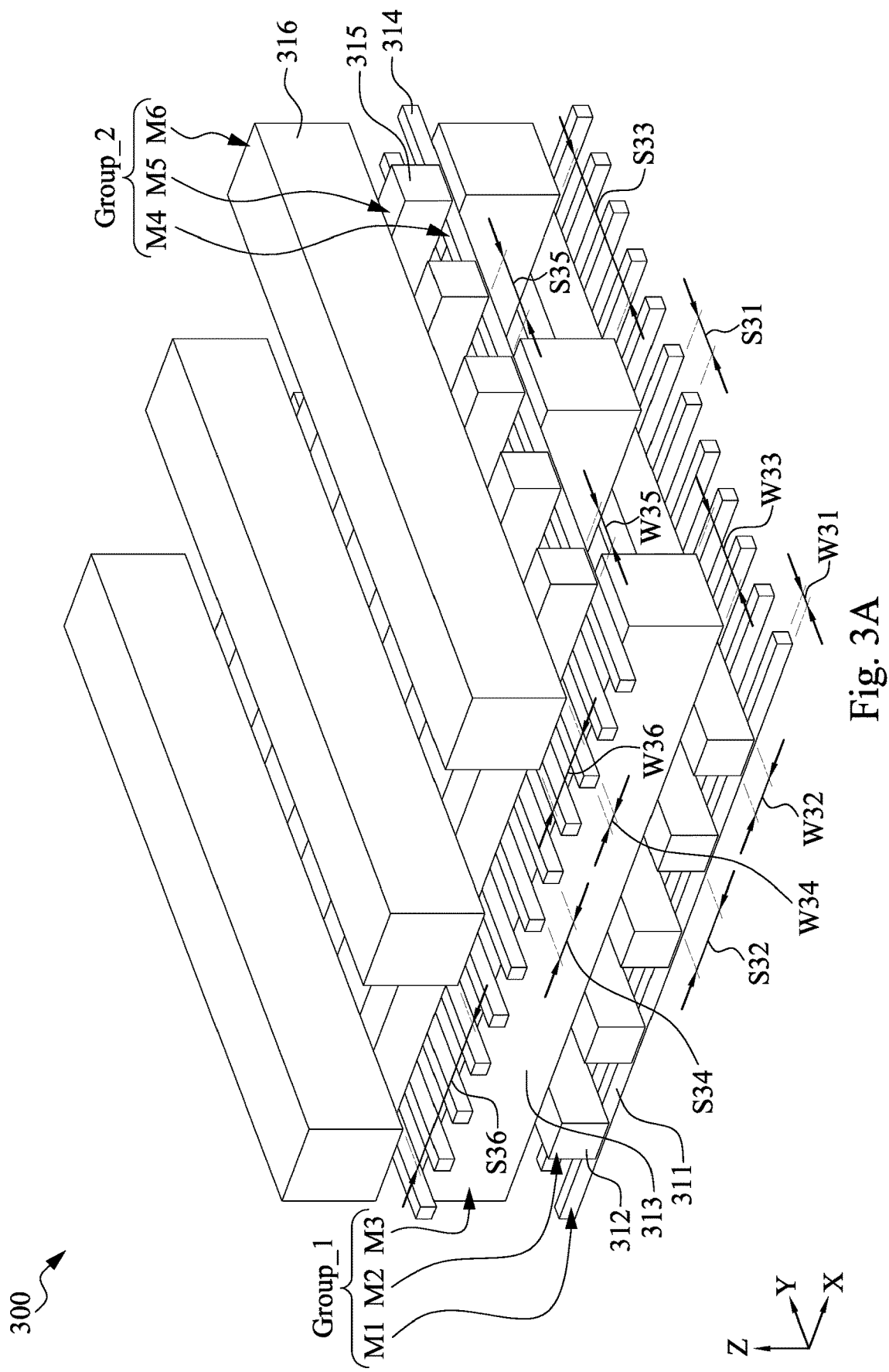
FIG. 3A is a perspective view of a layout including exemplary models of grouped metallization layers in some embodiments of the present disclosure.
Figure 5A:
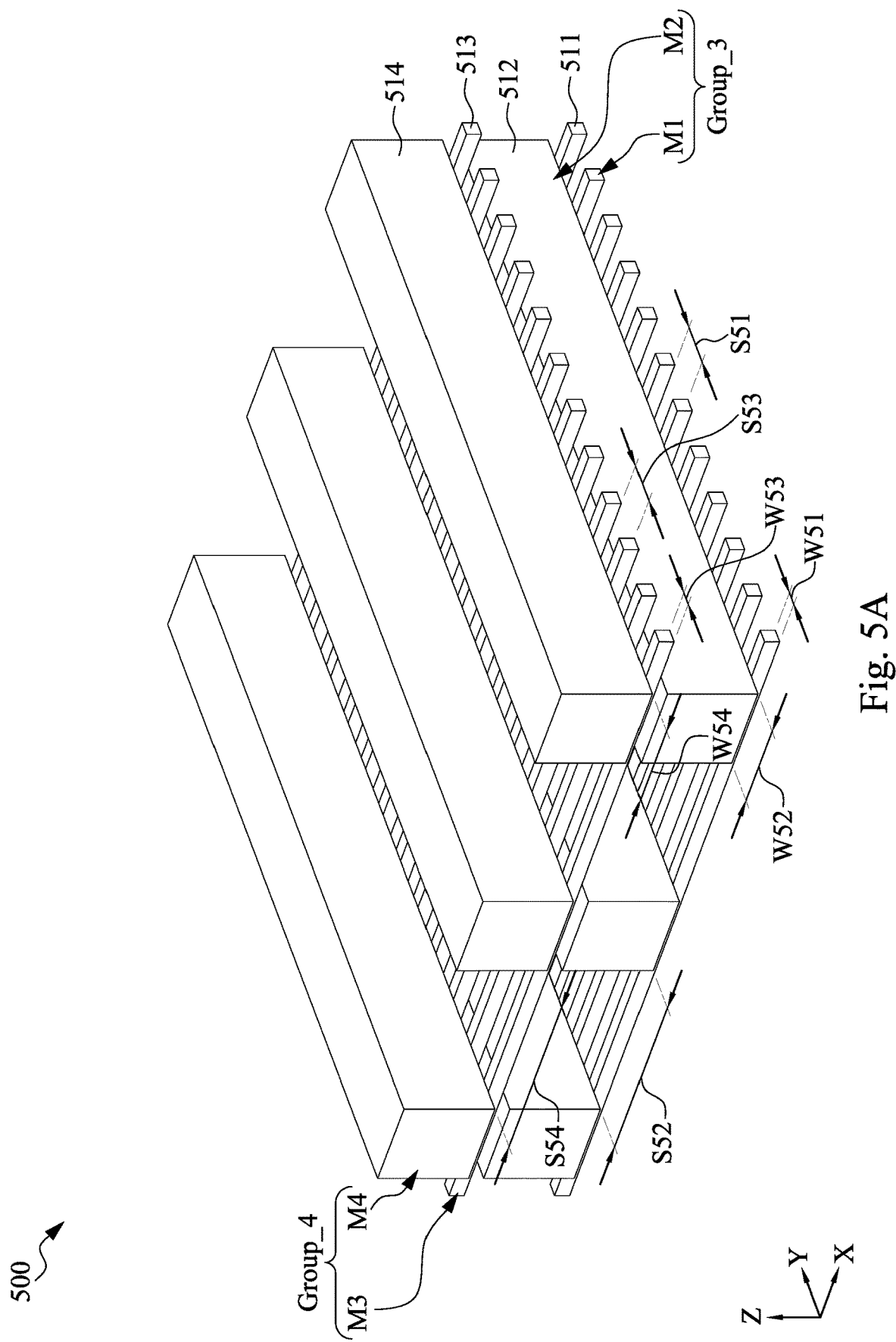
FIG. 5A is a perspective view of a layout including exemplary models of grouped metallization layers in some embodiments of the present disclosure.

In operation 220 of the APR function 200, optimization is performed upon the placed-and-routed layout generated from the operation 218. The optimization includes examining, for example, whether the placed-and-routed layout meets eligible electrical properties (e.g., parasitic resistance and capacitance), manufacturing criteria and/or design specification, and then repeating the placement operation 214, CTS operation 216 and routing operation again if the examination result is unfavorable, until the examination result is acceptable. For example, an initial routing operation 218 selects one or more models of grouped metallization layers (e.g., Models Group_1 and Group_2 as illustrated in FIG. 3A) from the libraries 208, and if the examination result in the optimization operation 220 is unfavorable, the APR function 200 may loop back to the routing operation 218 to select other grouped metallization layers models (e.g., Models Group_3 and Group_4 as illustrated in FIG. 5A) to replace the previously selected models (e.g., Models Group_1 and Group_2 as illustrated in FIG. 3A). Once the APR function 200 is complete, IC chips can be fabricated based on the optimized placed-and-routed layout, for example, by performing the stages 112-122 in the fabrication flow 100 as illustrated in FIG. 1.

FIGS. 3A-10C illustrate various exemplary models of grouped metallization layers and IC structures manufactured using the corresponding models. These models are non-limiting examples and can be defined in the model libraries 208 as shown in FIG. 2. The APR function 200 can initially select any combination of the models from the model libraries 208, and then replace one or more selected models with one or more other models from the libraries 208, if the examination result of the optimization operation 220 is unfavorable. These exemplary models and corresponding IC structures are described in greater detail below.

Figure 3B:
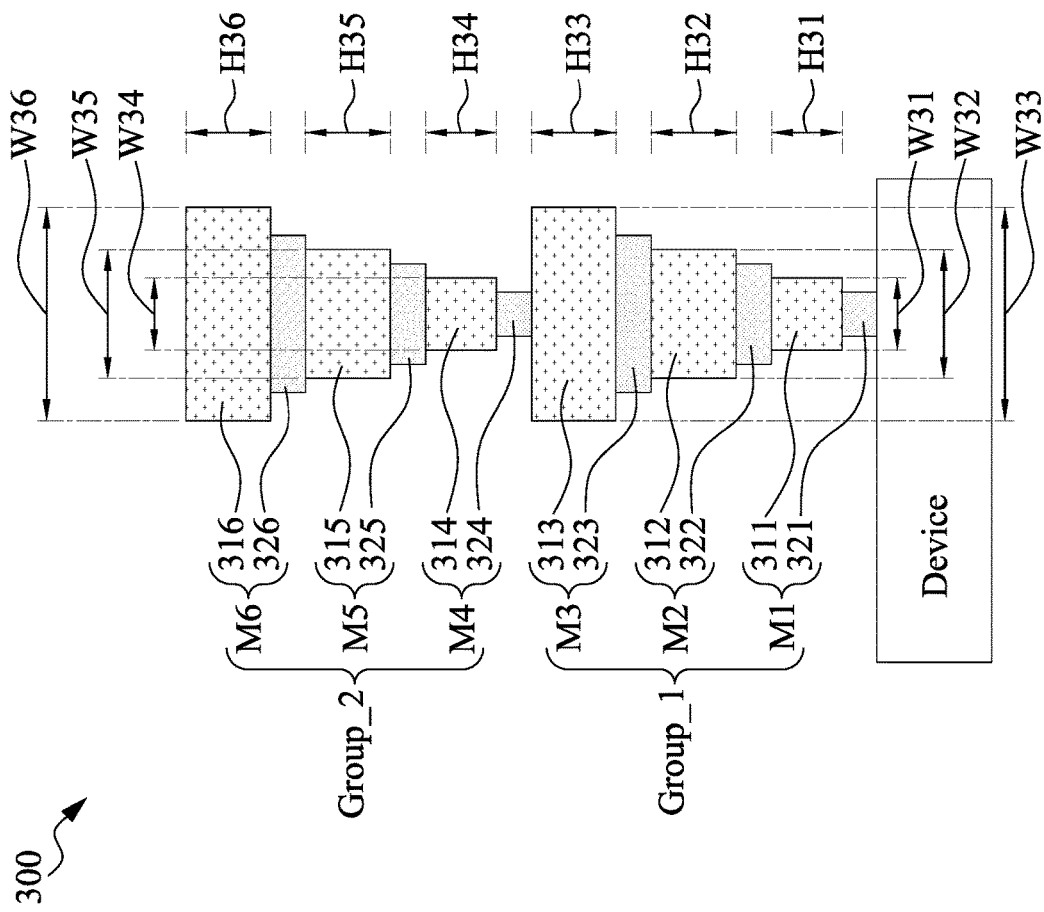
FIG. 3B is a schematic diagram illustrating a metal line width difference among metallization layers in the layout of FIG. 3A.
Figure 3C:
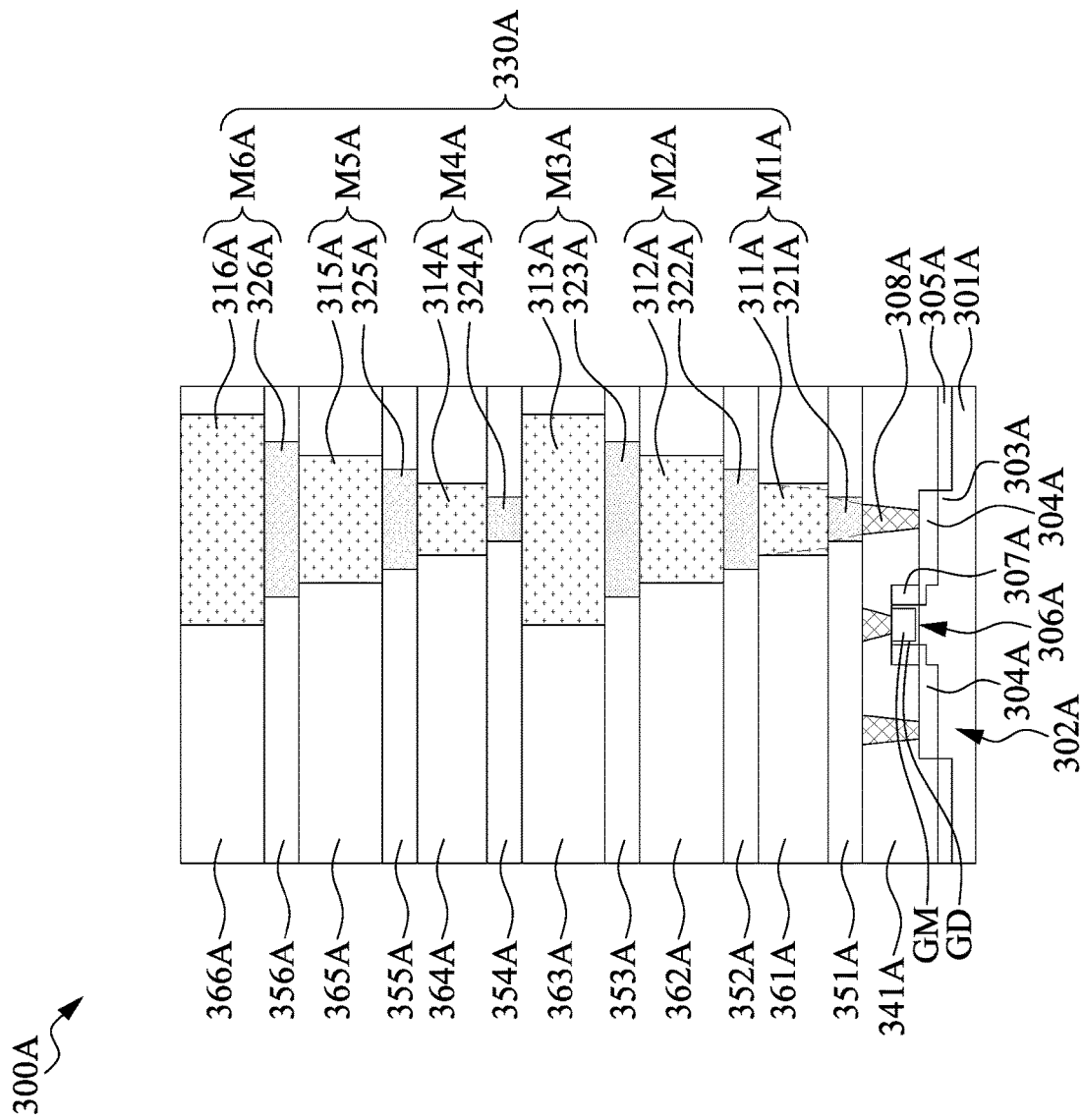
FIG. 3C is a cross-sectional view of an IC structure fabricated using the layout of FIG. 3A according to some embodiments of the present disclosure.

FIG. 3A is a perspective view of a layout 300 including exemplary models of grouped metallization layers in some embodiments of the present disclosure. FIG. 3B is a schematic diagram illustrating a metal line width difference among metallization layers in the layout of FIG. 3A. The layout 300 is usable to manufacture an IC 300A as illustrated in FIG. 3C.

The layout 300 includes a first grouped metallization layers model Group_1 and a second grouped metallization layers model Group_2 stacked over the first grouped metallization layers model Group_1. These models Group_1 and Group_2 can be defined in the libraries 208 as illustrated in FIG. 2. The first grouped metallization layers model Group_1 includes a first metallization layer M1, a second metallization layer M2 over the first metallization layer M1 and a third metallization layer M3 over the second metallization layer M2.

As illustrated in FIGS. 3A and 3B, the first metallization layer M1 includes horizontal interconnects, such as a plurality of first metal lines 311, extending horizontally or laterally above semiconductor devices (e.g., transistors), and vertical interconnects, such as metal vias 321, extending vertically between the first metal lines 311 and the semiconductor devices. As such, the metal vias 321 provide electrical connections between the first metal lines 311 and the semiconductor devices. As illustrated in FIG. 3A, the first metal lines 311 extend along a first direction of the layout 300, e.g., the X direction, and are spaced apart from each other along a second direction of the layout 300, e.g., the Y direction. In some embodiments, the second direction Y is perpendicular to the first direction X. The first metal lines 311 each have a first line width W31 measured in the Y direction, and each first metal line 311 is separated from an adjacent first metal line 311 in the Y direction by a first line-to-line spacing S31.

The second metallization layer M2 also includes horizontal interconnects, such as a plurality of second metal lines 312, extending horizontally or laterally above the first metallization layer M1, and vertical interconnects, such as metal vias 322, extending vertically between the second metal lines 312 and the first metal lines 311. The metal vias 322 thus provide electrical connections between the second metal lines 312 and the first metal lines 311. The second metal lines 312 extend along the Y direction and are spaced apart from each other along the X direction. Stated differently, the second metal lines 312 extend in a direction perpendicular to longitudinal directions of the first metal lines 311. The second metal lines 312 each have a first line width W32 measured in the X direction, and each second metal line 312 is separated from an adjacent second metal line 312 in the X direction by a second line-to-line spacing S32.

The third metallization layer M3 also includes horizontal interconnects, such as a plurality of second metal lines 313, extending horizontally or laterally above the second metallization layer M2, and vertical interconnects, such as metal vias 323, extending vertically between the third metal lines 313 and the second metal lines 312. The metal vias 323 thus provide electrical connections between the third metal lines 313 and the second metal lines 312. The third metal lines 313 extend along the X direction and are spaced apart from each other along the Y direction, as illustrated in FIG. 3A. Stated differently, the third metal lines 313 extend in a direction perpendicular to longitudinal directions of the second metal lines 312 and parallel with longitudinal directions of the first metal lines 311. The third metal lines 313 each have a third line width W33 measured in the Y direction, and each third metal line 313 is separated from an adjacent second metal line 312 in the Y direction by a third line-to-line spacing S33.

The first line width W31 of the first metal lines 311 is less than the second line width W32 of the second metal lines 312, and the second line width W32 is less than the third line width W33 of the third metal lines 313. Moreover, the first line-to-line spacing S31 of the first metal lines 311 is less than the second line-to-line spacing S32 of the second metal lines 312, and the second line-to-line spacing S32 is less than the third line-to-line spacing S33 of the third metal lines 313. As a result, the routing density of the first metallization layer M1 is greater than that of the upper metallization layers M2 and M3, which in turn helps to connect the scaled-down devices (e.g., transistors at 10, 7, 5 or 3 nm technology node) below the first metallization layer M1. Moreover, because the line widths W32 and W33 of upper metallization layers M2 and M3 are greater than the line with W31 of the lower metallization layer M1, the upper metallization layers M2 and M3 can contribute to resistance reduction of nets.

In some embodiments, by way of example and not limitation, the line height H31 of the first metal lines 311 (which is measured in the Z direction perpendicular to the X-Y plane as illustrated in FIG. 3A) is less than the line height H32 of the second metal lines 312, and the line height H33 of the third metal lines 313 is the same as the line height of the second metal lines 312. In some embodiments, by way of example and not limitation, the line height H31 of the first metal lines 311 is greater than the via height of the vias 321, the line height H32 of the second metal lines 312 is greater than the via height of the vias 322, and the line height H33 of the third metal lines 313 is greater than the via height of the vias 323.

The second grouped metallization layers model Group_2 includes a fourth metallization layer M4, a fifth metallization layer M5 over the fourth metallization layer M4 and a sixth metallization layer M6 over the fifth metallization layer M5.

As illustrated in FIGS. 3A and 3B, the fourth metallization layer M4 includes horizontal interconnects, such as a plurality of fourth metal lines 314, extending horizontally or laterally above the third metallization layer M3, and vertical interconnects, such as metal vias 324, extending vertically between the forth metal lines 314 and the third metal lines 313. As such, the metal vias 324 provide electrical connections between the fourth metal lines 314 and the third metal lines 313. As illustrated in FIG. 3A, the fourth metal lines 314 extend along the X direction and are spaced apart from each other along the Y direction. The fourth metal lines 314 each have a fourth line width W34 measured in the X direction, and each fourth metal line 314 is separated from an adjacent fourth metal line 314 in the X direction by a fourth line-to-line spacing S34.

The fifth metallization layer M5 also includes horizontal interconnects, such as a plurality of fifth metal lines 315, extending horizontally or laterally above the fourth metallization layer M4, and vertical interconnects, such as metal vias 325, extending vertically between the fifth metal lines 315 and the fourth metal lines 314. The metal vias 325 thus provide electrical connections between the fifth metal lines 315 and the fourth metal lines 314. The fifth metal lines 315 extend along the X direction and are spaced apart from each other along the Y direction. Stated differently, the fifth metal lines 315 extend in a direction perpendicular to longitudinal directions of the fourth, second metal lines 314, 312 and parallel with longitudinal directions of third, first metal lines 313, 311. The fifth metal lines 315 each have a first line width W35 measured in the Y direction, and each fifth metal line 315 is separated from an adjacent fifth metal line 315 in the X direction by a fifth line-to-line spacing S35.

The sixth metallization layer M6 also includes horizontal interconnects, such as a plurality of sixth metal lines 316, extending horizontally or laterally above the fifth metallization layer M5, and vertical interconnects, such as metal vias 326, extending vertically between the sixth metal lines 316 and the fifth metal lines 315. The metal vias 326 thus provide electrical connections between the sixth metal lines 316 and the fifth metal lines 315. The sixth metal lines 316 extend along the Y direction and are spaced apart from each other along the X direction, as illustrated in FIG. 3A. Stated differently, the sixth metal lines 316 extend in a direction perpendicular to longitudinal directions of the fifth, third, first metal lines 315, 313, 311 and parallel with longitudinal directions of the fourth, second metal lines 314, 312. The sixth metal lines 316 each have a sixth line width W36 measured in the X direction, and each sixth metal line 316 is separated from an adjacent second metal line 312 in the X direction by a sixth line-to-line spacing S36.

The fourth line width W34 of the fourth metal lines 314 is less than the fifth line width W35 of the fifth metal lines 315, and the fifth line width W35 is less than the sixth line width W36 of the sixth metal lines 316. Moreover, the fourth line-to-line spacing S34 of the fourth metal lines 314 is less than the fifth line-to-line spacing S35 of the fifth metal lines 315, and the fifth line-to-line spacing S35 is less than the sixth line-to-line spacing S36 of the sixth metal lines 316. As a result, the routing density of the fourth metallization layer M4 is greater than that of the upper metallization layers M5 and M6, which in turn helps to route more nets. Moreover, because the line widths W35 and W36 of upper metallization layers M5 and M6 are greater than the line with W34 of the lower metallization layer M4, the upper metallization layers M5 and M6 can contribute to resistance reduction of nets.

In some embodiments, the third line width W33 of the third metal lines 313 is greater than the fourth line width W34 of the fourth metal lines 314 above the third metal lines 313. As a result, the third metal lines 313 have a lower resistance than the fourth metal lines 314. In this way, longer nets (i.e., longer conductive paths) can be routed on the third metallization layer M3 to reduce the resistance of the longer nets, and shorter nets (i.e., shorter conductive paths) can be routed on other metallization layers.

Figure 6A:
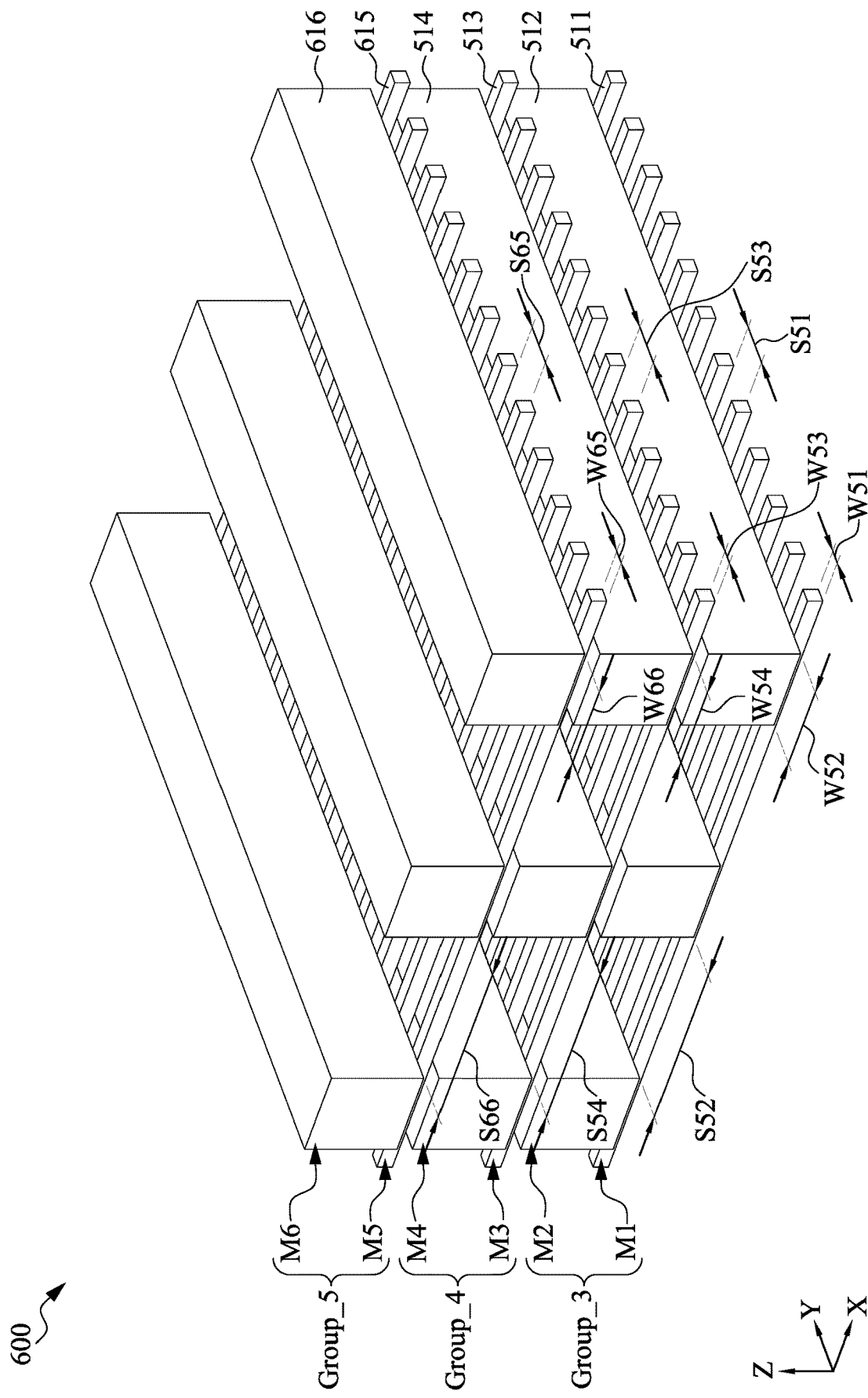
FIG. 6A is a perspective view of a layout including exemplary models of grouped metallization layers in some embodiments of the present disclosure.

In some embodiments, by way of example and not limitation, the line height H34 of the fourth metal lines 314 (which is measured in the Z direction perpendicular to the X-Y plane as illustrated in FIG. 6A) is less than the line height H35 of the fifth metal lines 315, and the line height H36 of the sixth metal lines 316 is the same as the line height of the fifth metal lines 315. In some embodiments, by way of example and not limitation, the line height H34 of the fourth metal lines 314 is greater than the via height of the vias 324, the line height H35 of the fifth metal lines 315 is greater than the via height of the vias 325, and the line height H36 of the sixth metal lines 316 is greater than the via height of the vias 326.

In some embodiments, the first line width W31 and the first line spacing S31 of the first metal lines 311 are respectively the same as the fourth line width W34 and the fourth line spacing S34 of the fourth metal lines 314, the second line width W32 and the second line spacing S32 of the second metal lines 312 are respectively the same as the fifth line width W35 and the fifth line spacing S35 of the fifth metal lines 315, and the third line width W33 and the third line spacing S33 of the third metal lines 313 are respectively the same as the sixth line width W36 and the sixth line spacing S36 of the sixth metal lines 316. By way of example and not limitation, the line widths of metal lines 311-316 may satisfy the relation W31=W34<W32=W35<W33=W36, and the line-to-line spacings of metal lines 311-316 may satisfy the relation S31=S34<S32=S35<S33=S36. Moreover, the line heights of metal lines 311-316 may satisfy the relation H31=H34<H32=H33=H35=H36.

FIG. 3C is a cross-sectional view of an IC structure 300A fabricated using the layout 300 according to some embodiments of the present disclosure, and thus the IC structure 300A inherits geometries of those patterns in the layout 300, as described in greater detail below. The IC structure 300A can be fabricated in fab at the stage 122 of the fabrication flow 100 as illustrated FIG. 1. The IC structure 300A is a non-limiting example for facilitating the illustration of the present disclosure.

In some embodiments, the IC structure 300A may comprise a substrate 301A. The substrate 301A may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 301A may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

One or more active and/or passive devices 302A (illustrated in FIG. 3C as a single transistor) are formed on the substrate 301A. The one or more active and/or passive devices 302A may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also formed as appropriate for a given application.

In the depicted embodiments, the devices 302A are fin field-effect transistors (FinFET) that are three-dimensional MOSFET structure formed in fin-like strips of semiconductor protrusions 303A referred to as fins. The cross-section shown in FIG. 3C is taken along a longitudinal axis of the fin in a direction parallel to the direction of the current flow between the source/drain regions 304A. The fin 303A may be formed by patterning the substrate 301A using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 303A by etching a trench into the substrate 301A using, for example, reactive ion etching (RIE). FIG. 3C illustrates a single fin 303A, although the substrate 301A may comprise any number of fins.

Shallow trench isolation (STI) regions 305A formed around lower portions of the fin 303A are illustrated in FIG. 3C. STI regions 305A may be formed by depositing one or more dielectric materials (e.g., silicon oxide) to completely fill the trenches around the fins and then recessing the top surface of the dielectric materials. The dielectric materials of the STI regions 305A may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 305A may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 305A such that upper portions of fins 303A protrude from surrounding insulating STI regions 305A. In some cases, the patterned hard mask used to form the fins 303A may also be removed by the planarization process.

In some embodiments, a gate structure 306A of the FinFET device 302A illustrated in FIG. 3C is a high-k, metal gate (HKMG) gate structure that may be formed using a gate-last process flow. In a gate-last process flow a sacrificial dummy gate structure (not shown) is formed after forming the STI regions 305A. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 305A. As described in greater detail below, the dummy gate structure may be replaced by the HKMG gate structure 306A as illustrated in FIG. 3C. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source/drain regions 304A and spacers 307A of FinFET 302A, illustrated in FIG. 3C, are formed, for example, self-aligned to the dummy gate structures. Spacers 307A may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 307A along the sidewalls of the dummy gate structures extending laterally onto a portion of the surface of the fin 303A.

Source/drain regions 304A are semiconductor regions in direct contact with the semiconductor fin 303A. In some embodiments, the source/drain regions 304A may comprise heavily-doped regions and relatively lightly-doped drain extensions, or LDD regions. Generally, the heavily-doped regions are spaced away from the dummy gate structures using the spacers 307A, whereas the LDD regions may be formed prior to forming spacers 307A and, hence, extend under the spacers 307A and, in some embodiments, extend further into a portion of the semiconductor fin 303A below the dummy gate structure. The LDD regions may be formed, for example, by implanting dopants (e.g., As, P, B, In, or the like) using an ion implantation process.

The source/drain regions 304A may comprise epitaxially grown regions. For example, after forming the LDD regions, the spacers 307A may be formed and, subsequently, the heavily-doped source and drain regions may be formed self-aligned to the spacers 307A by first etching the fins 303A to form recesses, and then depositing a crystalline semiconductor material in the recess by a selective epitaxial growth (SEG) process that may fill the recess and may extend further beyond the original surface of the fin 303A to form raised source/drain epitaxy structures. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions 304A either in situ during SEG, or by an ion implantation process performed after the SEG, or by a combination thereof.

Once the source/drain regions 304A are formed, a first ILD layer (e.g., lower portion of the ILD layer 341A) is deposited over the source/drain regions 304A. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer. The HKMG gate structures 306A, illustrated in FIG. 3C, may then be formed by first removing the dummy gate structures using one or more etching techniques, thereby creating trenches between respective spacers 307A. Next, a replacement gate dielectric layer GD comprising one or more dielectrics, followed by a replacement gate metal layer GM comprising one or more metals, are deposited to completely fill the trenches. Excess portions of the gate structure layers may be removed from over the top surface of first ILD using, for example, a CMP process. The resulting structure, as illustrated in FIG. 3C, may include remaining portions of the HKMG gate layers GD and GM inlaid between respective spacers 307A.

The gate dielectric layer GD includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the gate metal layer GM may be a multilayered metal gate stack comprising a barrier layer, a work function layer, and a gate-fill layer formed successively on top of gate dielectric layer GD. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the trench may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

After forming the HKMG structure 306A, a second ILD layer is deposited over the first ILD layer, and the first and second ILD layers are in combination referred to as the ILD layer 341A, as illustrated in FIG. 3C. In some embodiments, the insulating materials to form the first and second ILD layers may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first and second ILD layers may be deposited using any suitable method, such as CVD, physical vapor deposition (PVD), ALD, PEALD, PECVD, SACVD, FCVD, spin-on, and/or the like, or a combination thereof.

Contacts 308A are formed respectively over the gate structure 306A and the source/drain regions 304A of FinFET 302A. The contacts 308A may be formed using photolithography, etching and deposition techniques. For example, a patterned mask may be formed over the ILD layer 341A and used to etch openings that extend through the ILD layer 341A to expose the gate structure 306A as well as the source/drain regions 304A. Thereafter, conductive liner may be formed in the openings in the ILD layer 341A. Subsequently, the openings are filled with a conductive fill material. The liner comprises barrier metals used to reduce out-diffusion of conductive materials from the contacts 308A into the surrounding dielectric materials. In some embodiments, the liner may comprise two barrier metal layers. The first barrier metal comes in contact with the semiconductor material in the source/drain regions 304A and may be subsequently chemically reacted with the heavily-doped semiconductor in the source/drain regions 304A to form a low resistance ohmic contact, after which the unreacted metal may be removed. For examle, if the heavily-doped semiconductor in the source/drain regions 304A is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the ILD layer 341A. The resulting conductive plugs extend into the ILD layer 341A and constitute contacts 308A making physical and electrical connections to the electrodes of electronic devices, such as the tri-gate FinFET 302A illustrated in FIG. 3C. In some embodiments, the source/drain contacts 308A, which are shown as vertical connectors, may be extended to form conductive lines which transport current laterally.

After forming the contacts 308A, an interconnect structure 330A including multiple interconnect levels may be formed, stacked vertically above the ILD layer 341A, in accordance with a back-end-of-line (BEOL) scheme adopted for the integrated circuit design. The interconnect structure 330A electrically interconnects the one or more active and/or passive devices 302A to form functional electrical circuits within the IC structure 300A. The interconnect structure 330A may comprise metallization layers M1A-M6A fabricated using the layout patterns of metallization layers M1-M6 of the layout 300 as illustrated in FIGS. 3A and 3B, and thus the metallization layers M1A-M6A inherit geometries of the layout patterns of the layout 300, as described in greater detail below.

The metallization layers M1A-M6A include inter-metal dielectric (IMD) layers 351A-356A and IMD layers 361A-366A, respectively. The IMD layers 361A-366A are formed over the corresponding IMD layers 351A-356A. The metallization layers M1A-M6A include horizontal interconnects, such as metal lines 311A-316A, respectively extending horizontally or laterally in the IMD layers 361A-366A and vertical interconnects, such as metal vias 321A-326A, respectively extending vertically in the IMD layers 351A-356A. Formation of the metallization layers M1A-M6A can be referred to as a back-end-of-line (BEOL) process.

The metallization layers M1A-M6A are formed using any suitable method, such as a single damascene process, a dual damascene process, or the like. By way of example and not limitation, fabrication of the metallization layer M1A includes forming the IMD layer 351A over the ILD layer 341A, patterning the IMD layer 351A to form via openings in the IMD layer 351A using a photomask with layout patterns of the vias 321 in the layout 300, depositing one or more metals into the via openings, planarizing the one or more metals until reaching a top surface of the IMD layer 351A (e.g., by using CMP) while leaving metal vias 321A in the via openings, forming the IMD layer 361A over the metal vias 321A, patterning the IMD layer 361A to form trenches in the IMD layer 361A using another photomask with layout patterns of metal lines 311 in the layout 300, depositing one or more metals into the trenches in the IMD layer 361A, and planarizing the one or more metals until reaching a top surface of the IMD layer 361A (e.g., by using CMP) to leave the metal lines 311A in the trenches in the IMD layer 361A. Fabrication of other metallization layers M2A-M6A are similar to that of the metallization layer M1A, and thus are not repeated for the sake of brevity.

In some embodiments, the ILD layer 341A and the IMD layers 351A-356A, 361A-366A may include low-k dielectric materials having k values, for example, lower than about 4.0 or even 2.0 disposed between such metal features. In some embodiments, the ILD and IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The metal lines 311A-316A and metal vias 321A-326A may comprise conductive materials such as copper, aluminum, tungsten, combinations thereof, or the like. In some embodiments, the metal lines 311A-316A and metal vias 321A-326A may further comprise one or more barrier/adhesion layers (not shown) to protect the respective IMD layers 351A-356A and 361A-366A from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like. Although the metal lines 311A-316A and metal vias 321A-326A illustrated in FIG. 3C have vertical sidewalls, they may have tapered sidewalls, as indicated by dash lines in the metal line 311A and metal via 321A as shown in FIG. 3C. This is because that the etching process of forming via openings and trenches in the IMD layers 351A-356A and 361A-366A may lead to tapered sidewalls in the via openings and trenches.

The metal lines 311A-316A and metal vias 321A-326A have the same geometries as the corresponding metal lines 311-316 and metal vias 321-326 in the layout 300. In greater detail, the metal lines 311A, 313A and 315A extend along a first direction (e.g., the X direction as illustrated in perspective view of FIG. 3A) and are spaced apart from each other along a second direction (e.g., the Y direction as illustrated in perspective view of FIG. 3A). The metal lines 312A, 314A and 316A extend along the second direction (Y direction as illustrated in FIG. 3A) and are spaced apart from each other along the first direction (X direction as illustrated in FIG. 3A). As a result, longitudinal directions of the metal lines 311A, 313A and 315A are perpendicular to longitudinal directions of the metal lines 312A, 314A and 316A.

The metal lines 311A, 313A, 315A have respective line widths W31, W33, W35 measured in the Y direction as illustrated in FIG. 3A and arranged at respective line-to-line spacings S31, S33, S35 measured in the Y direction as illustrated in FIG. 3A. The metal lines 312A, 314A, 316A have respective line widths W32, W34, W36 measured in the X direction as illustrated in FIG. 3A and arranged at respective line-to-line spacings S32, S34, S36 measured in the X direction as illustrated in FIG. 3A.

The line width W31 of the metal lines 311A is less than the line width W32 of the metal lines 312A, and the line width W32 is less than the line width W33 of the metal lines 313A. Moreover, the line-to-line spacing S31 of the metal lines 311A is less than the line-to-line spacing S32 of the metal lines 312A, and the line-to-line spacing S32 is less than the line-to-line spacing S33 of the metal lines 313A. As a result, the routing density of the lower metallization layer M1A is greater than that of the upper metallization layers M2A and M3A, which in turn helps to connect the FinFETs 302A below the metallization layer M1A. Moreover, because the line widths W32 and W33 of upper metallization layers M2A and M3A are greater than the line with W31 of the lower metallization layer M1A, the upper metallization layers M2A and M3A can contribute to resistance reduction of nets.

Moreover, the line widths W32, W33 of the metal lines 312A, 313A are greater than the line width W34 of the metal lines 314A extending above the metal lines 313A. As a result, the metal lines 312A, 313A have a lower resistance than the metal lines 314A. In this way, longer nets (i.e., longer conductive paths) can be routed on the metallization layer M3A and/or the metallization layer M2A to reduce the resistance of the longer nets, and shorter nets (i.e., shorter conductive paths) can be routed on the metallization layer M4A.

Further, the line width W35 of the metal lines 315A is greater than the line width W34 of the metal lines 314A, and the line width W36 of the metal lines 316A is greater than the line width W35. Moreover, the line-to-line spacing S34 of metal lines 314A is less than the line-to-line spacing S35 of the metal lines 315A, the line-to-line spacing S36 of the metal lines 316A, the line-to-line spacing S33 of the metal lines 313A, and the line-to-line spacing S32 of the metal lines 312A. As a result, the routing density of the metallization layer M4A is greater than that of the upper metallization layers M5A and M6A and the lower metallization layers M3A and M2A, which in turn helps to route more nets on the metallization layer M4A than on the metallization layers M2A, M3A, M5A and M6A. Moreover, because the line widths W35, W36 of upper metallization layers M5A and M6A are greater than the line with W34 of the lower metallization layer M4A, the upper metallization layers M5A and M6A can contribute to resistance reduction of nets.

Figure 4A:
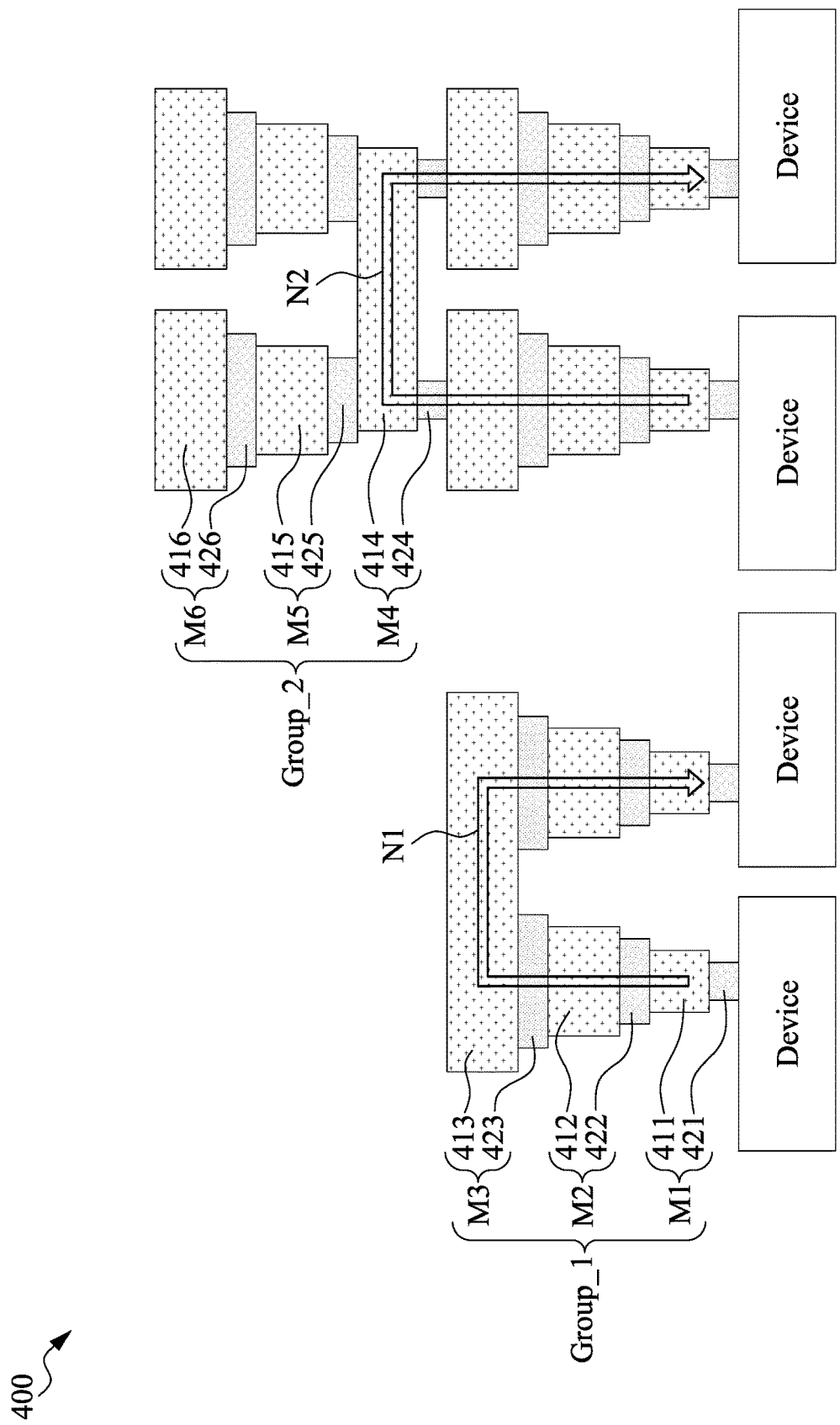
FIG. 4A is a schematic diagram illustrating an exemplary net routed in a layout having similar metallization layers as that in the layout of FIG. 3A.

FIG. 4A is a schematic diagram illustrating an exemplary long net N1 and an exemplary short net N2 routed in a layout 400 having similar metallization layers as that in the layout 300. The layout 400 is usable to manufacture an IC 400A as illustrated in FIG. 4B.

The layout 400 includes the first grouped metallization layers model Group_1 and the second grouped metallization layers model Group_2 stacked over the first grouped metallization layers model Group_1, as described above. The first grouped metallization layers model Group_1 includes a first metallization layer M1, a second metallization layer M2 over the first metallization layer M1 and a third metallization layer M3 over the second metallization layer M2. The second grouped metallization layers model Group_2 includes a fourth metallization layer M4, a fifth metallization layer M5 over the fourth metallization layer M4 and a sixth metallization layer M6 over the fifth metallization layer M5. Geometries of the metal lines 411-416 and the metal vias 421-426 in the metallization layers M1-M6 are the same as that of the metal lines 311-316 and metal vias 321-326 in the layout 300 as shown in FIGS. 3A-3B, and thus are not repeated for the sake of brevity.

A long net N1 connecting two semiconductor devices is routed on the metallization layer M3, rather than routed on an upper metallization layer (e.g., the sixth metallization layer M6). Via counts used for the long net N1 are thus reduced. For example, in the depicted layout 400 where the long net N1 is routed on the third metallization layer M3, the net N uses six vias (e.g., two vias 421, two vias 422 and two vias 423). On the contrary, if the long net N1 is routed on the sixth metallization layer M6, this long net N1 may use twelve vias (e.g., two vias 421, two vias 422, two vias 423, two vias 424, two vias 425 and two vias 426), which in turn would lead to an increase in resistance. As a result, routing the long net N1 on a metallization layer lower than an upper metallization layer can result in resistance reduction for the long net N1. Moreover, because the short net N2 connecting other semiconductor devices has a shorter length (e.g., total length of metal lines of the net) than the long net N1, the short net N2 can be routed on a metallization layer higher than the metallization layer M3. By way of example and not limitation, the short net N2 is routed on the metallization layer M4 higher than the metallization layer M3 and having smaller metal line width and smaller line-to-line spacing than metallization layer M3, because the short net N2 has a more relaxed concern about signal delay as compared to the long net N1.

Figure 4B:
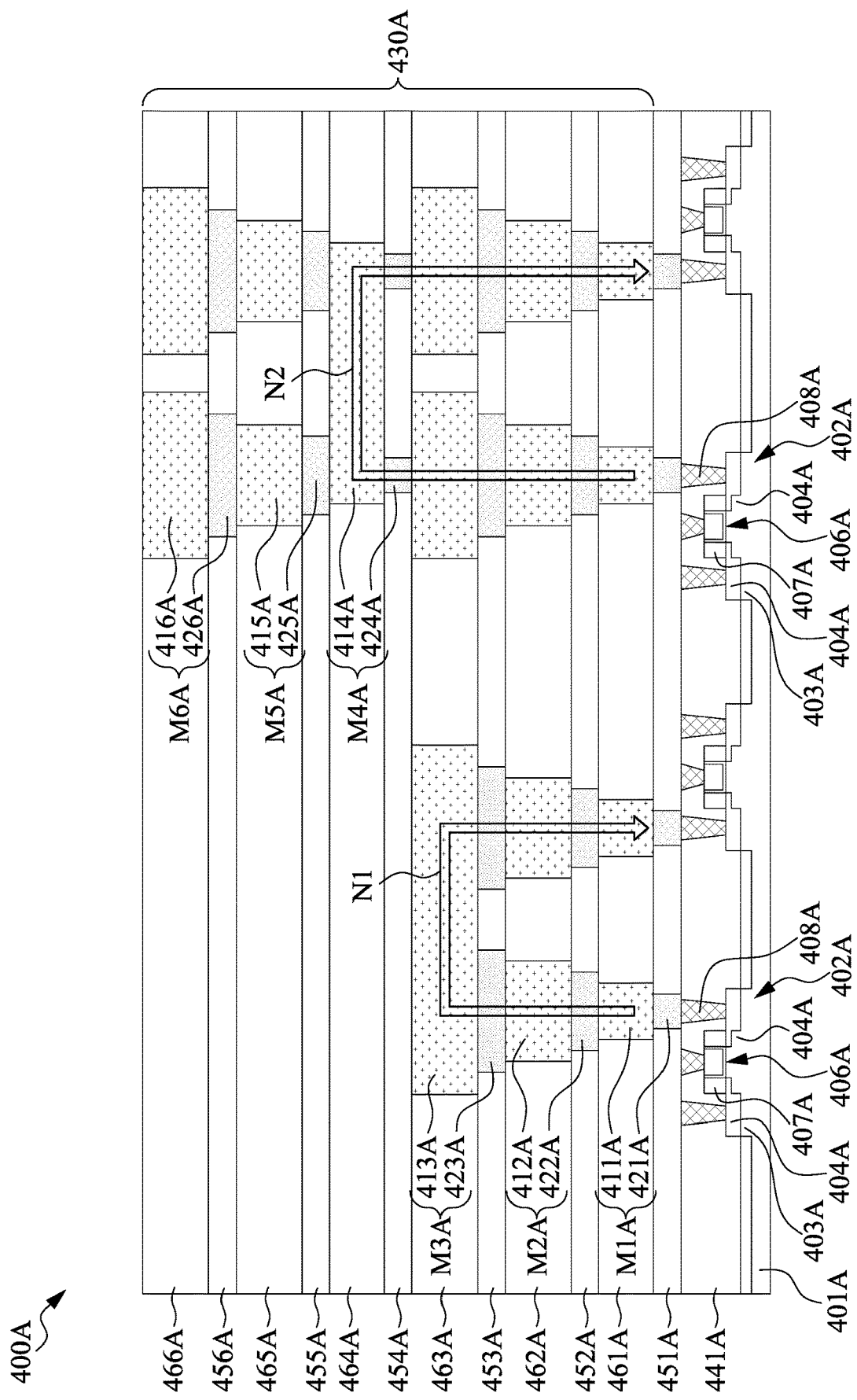
FIG. 4B is a cross-sectional view of an IC structure fabricated using the layout of FIG. 4A according to some embodiments of the present disclosure.

FIG. 4B is a cross-sectional view of an IC structure 400A fabricated using the layout 400 according to some embodiments of the present disclosure, and thus the IC structure 400A inherits geometry of those patterns in the layout 400. The IC structure 400A can be fabricated at the stage 122 of the fabrication flow 100 as illustrated FIG. 1. The IC structure 400A is a non-limiting example for facilitating the illustration of the present disclosure.

The IC structure 400A includes four devices 402A, a long net N1 electrically connecting two of the devices 402A, and a short net N2 connecting two of the devices 402A. In the depicted embodiments, the devices 402A are FinFETs each including a fin 403A protruding from substrate 401A and having lower portions laterally surrounded by STI regions 405A, source/drain regions 404A formed in the fin 403A, a HKMG gate structure 406A laterally between the source/drain regions 404A, and gate spacers 407A on opposite sidewalls of the gate structure 406A. Example materials and fabrication of the substrate 401A, the fin 403A, the source/drain regions 404A, the STI region 405A, the gate structure 406A and the gate spacers 407A are similar to that of the FinFET 302A as discussed previously with respect to FIG. 3C, and thus are not repeated for the sake of brevity.

The IC structure 400A further includes an ILD layer 441A over the FinFETs 402A, and contacts 408A extending through the ILD layer 441A to land on gate structures 406A and/or source/drain regions 404A of the FinFEts 402A. Exemplary materials and fabrication of the ILD layer 441A and the contacts 408A are similar to that of the ILD layer 341A and contacts 308A as discussed previously with respect to FIG. 3C, and thus are not repeated for the sake of brevity.

The IC structure 400A further includes an interconnect structure 430A including multiple metallization layers M1A-M6A fabricated using the layout patterns of metallization layers M1-M6 of the layout 400 as illustrated in FIG. 4A, and thus the metallization layers M1A-M6A inherit geometries of the layout patterns of the metallization layers M1-M6 in the layout 400. The metallization layers M1A-M6A include IMD layers 451A-456A and 461A-466A, respectively. The IMD layers 461A-466A are formed over the corresponding IMD layers 451A-456A. The metallization layers M1A-M6A include horizontal interconnects, such as metal lines 411A-416A, respectively extending horizontally or laterally in the IMD layers 461A-466A and vertical interconnects, such as metal vias 421A-426A, respectively extending vertically in the IMD layers 451A-456A. Example materials and fabrication of the metallization layers M1A-M6A of the IC structure 400A are similar to that of the IC structure 300A as discussed previously with respect to FIG. 3C, and thus are not repeated for the sake of brevity.

The long net N1 connecting two FinFETs 402A is routed on the metallization layer M3A, rather than routed on an upper metallization layer (e.g., the sixth metallization layer M6A). Via counts used for the long net N1 are thus reduced. For example, in the depicted IC structure 400A where the long net N1 is routed on the third metallization layer M3A, the long net N1 uses six vias (e.g., two vias 421A, two vias 422A and two vias 423A). On the contrary, if the long net N1 is routed on the sixth metallization layer M6A, this long net N1 may use twelve vias (e.g., two vias 421A, two vias 422A, two vias 423A, two vias 424A, two vias 425A and two vias 426A), which in turn would lead to an increase in resistance. As a result, routing the long net N1 on a metallization layer lower than an upper metallization layer can result in resistance reduction for the long net N1. Moreover, because the short net N2 connecting other FinFETs 402A has a shorter length (e.g., total length of metal lines of the net) than the long net N1, the short net N2 can be routed on a metallization layer higher than the metallization layer M3. By way of example and not limitation, the short net N2 is routed on the metallization layer M4A higher than the metallization layer M3 and having smaller metal line width and smaller line-to-line spacing than metallization layer M3A, because the short net N2 has a more relaxed concern about signal delay as compared to the long net N1.

Figure 5B:
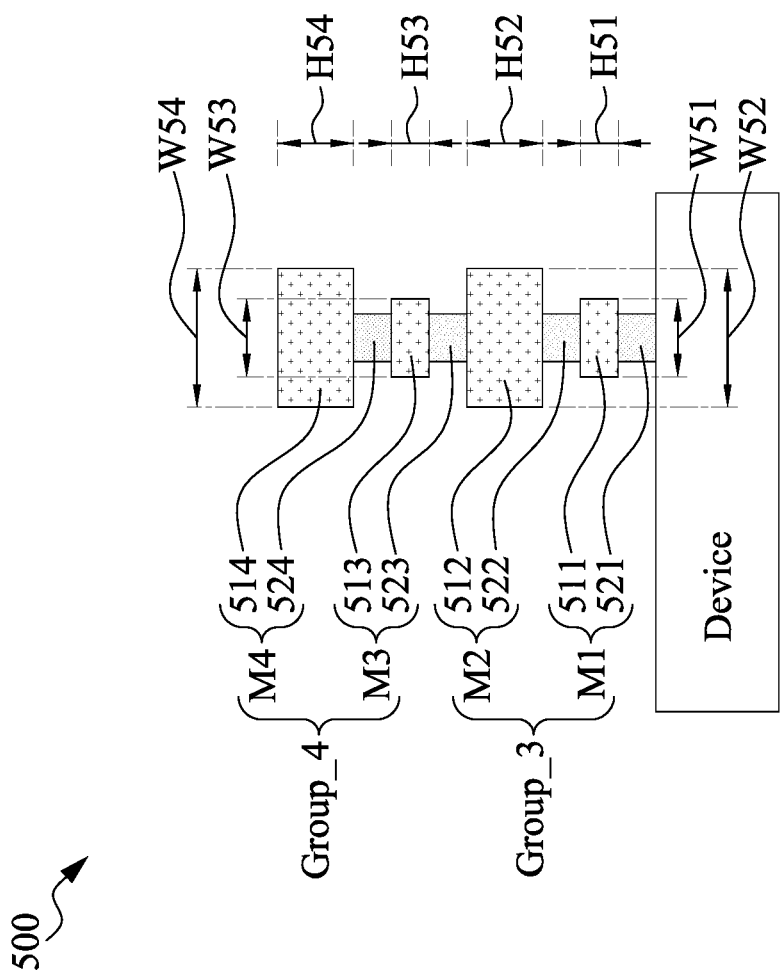
FIG. 5B is a schematic diagram illustrating a metal line width difference among metallization layers in the layout of FIG. 5A.
Figure 5C:
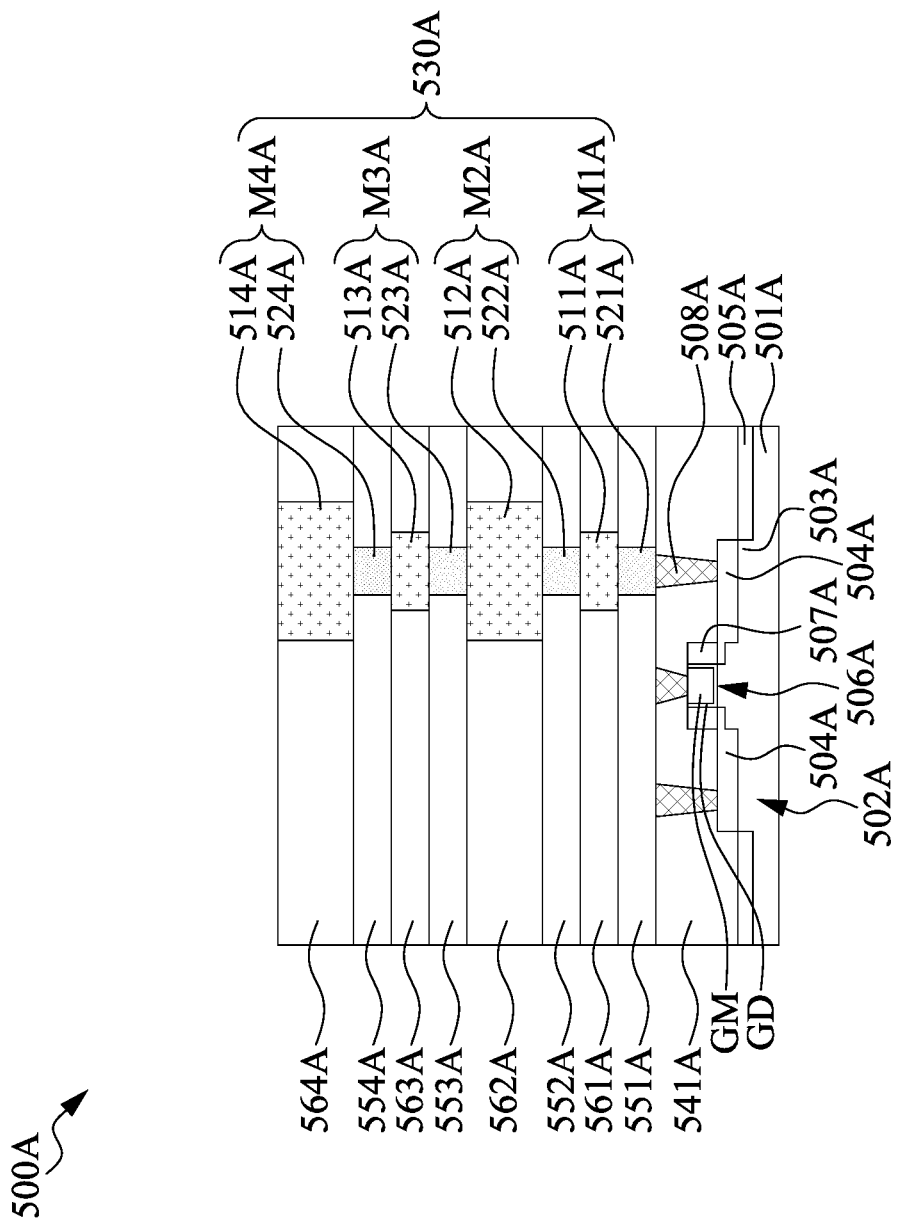
FIG. 5C is a cross-sectional view of an IC structure fabricated using the layout of FIG. 5A according to some embodiments of the present disclosure.

FIG. 5A is a perspective view of a layout 500 including other exemplary models of grouped metal layers in some embodiments of the present disclosure. FIG. 5B is a schematic diagram illustrating a metal line width difference among metallization layers in the layout of FIG. 5A. The layout 500 is usable to manufacture an IC structure 500A as illustrated in FIG. 5C.

The layout 500 includes a third grouped metallization layers model Group_3 and a fourth grouped metallization layers model Group_4 stacked over the third grouped metallization layers model Group_3. The models Group_3 and Group_4 are different from the models Group_1 and Group_2 as discussed previously with respect to FIGS. 3A and 3B, and can also be defined in the libraries 208 as illustrated in FIG. 2. The model Group_3 includes only two metallization layers, e.g., a first metallization layer M1 and a second metallization layer M2 over the first metallization layer M1. The model Group_4 also includes only two metallization layers, e.g., a third metallization layer M3 over second metallization layer M2 and a fourth metallization layer M4 over the third metallization layer M3.

The metallization layers M1-M4 include horizontal interconnects, such as metal lines 511-514 extending horizontally or laterally, and respective vertical interconnects, such as metal vias 521-524 respectively extending vertically. The metal lines 511 and 513 extend along a first direction (e.g., the X direction as illustrated in perspective view of FIG. 5A) and are spaced apart from each other along a second direction (e.g., the Y direction as illustrated in perspective view of FIG. 5A). The metal lines 512 and 514 extend along the second direction (Y direction as illustrated in FIG. 5A) and are spaced apart from each other along the first direction (X direction as illustrated in FIG. 5A). As a result, longitudinal directions of the metal lines 511 and 513 are perpendicular to longitudinal directions of the metal lines 512 and 514.

The metal lines 511, 513 have corresponding line widths W51, W53 measured in the Y direction, and are arranged at corresponding line-to-line spacings S51, S53 measured in the Y direction. The metal lines 512, 514 have corresponding line widths W52, W54 measured in the X direction, and are arranged at corresponding line-to-line spacings S52, S54 measured in the X direction. The line widths W51, W53 of the metal lines 511, 513 are less than the line widths W52, W54 of the metal lines 512, 514. The line-to-line spacings S51, S53 of the metal lines 511, 513 are less than the line-to-line spacings S52, S54 of the metal lines 512, 514. As a result, the routing density of the metallization layer M1 is greater than that of the metallization layer M2, which in turn helps to connect the scaled-down devices (e.g., transistors at 10, 7, 5 or 3 nm technology node) below the first metallization layer M1. Moreover, because the line width W52 of metal lines 512 is greater than the line width W53 of metal lines 513 above the metal lines 512, the metal lines 512 have a lower resistance than the metal lines 513. In this way, longer nets (i.e., nets having greater total length of metal lines) can be routed on the metallization layer M2 to reduce the resistance of the longer nets, and shorter nets (i.e., nets having less total length of metal lines) can be routed on the metallization layer M3.

In some embodiments, the line width W51 and line-to-line spacing S51 of the metal lines 511 are the same as the line width W53 and line-to-line spacing S53 of the metal lines 513, and the line width W52 and line-to-line spacing S52 of the metal lines 512 are the same as the line width W54 and line-to-line spacing S54 of the metal lines 514. Stated differently, the grouped metallization layers models Group_3 and Group_4 may have the same dimension parameters (e.g., the same number of metallization layers, the same line width and the same line spacing in corresponding metallization layers). For example, the metallization layer M1 of the model Group_3 has the same line width and the same line spacing as the metallization layer M3 of the model Group_4, and the metallization layer M2 of the model Group_3 has the same line width and the same line spacing as the metallization layer M4 of the model Group_4. However, in some other embodiments, the line width W51 and line-to-line spacing S51 of the metallization layer M1 may be different from the line width W53 and the line-to-line spacing S53 of the metallization layer M3, and the line width W52 and line-to-line spacing S52 of the metallization layer M2 may be different from the line width W54 and the line-to-line spacing S54 of the metallization layer M4.

In some embodiments, by way of example and not limitation, the line heights H51, H53 of the metal lines 511, 513 (which is measured in the Z direction perpendicular to the X-Y plane as illustrated in FIG. 5A) are less than the line heights H52, H54 of the metal lines 512, 514. In some embodiments, by way of example and not limitation, the line heights H51, H53 of the metal lines 511, 513 are less than the via heights of the vias 521-524, but the line heights H52, H54 of the metal lines 512, 514 are greater than the via heights of the vias 521-524. As illustrated in the depicted embodiments in FIGS. 5A and 5B, by way of example and not limitation, the line widths of metal lines 511-514 may satisfy the relation W51=W53<W52=W54, the line-to-line spacings of metal lines 511-514 may satisfy the relation S51=S53<S52=S54, and the line heights of metal lines 511-514 may satisfy the relation H51=H53<H52=H54.

FIG. 5C is a cross-sectional view of an IC structure 500A fabricated using the layout 500 according to some embodiments of the present disclosure, and thus the IC structure 500A inherits geometries of those patterns in the layout 500, as described in greater detail below. The IC structure 500A can be fabricated in fab at the stage 122 of the fabrication flow 100 as illustrated FIG. 1. The IC structure 500A is a non-limiting example for facilitating the illustration of the present disclosure.

The IC structure 500A includes a device 502A which may be a FinFET including a fin 503A protruding from substrate 501A and having lower portions laterally surrounded by STI regions 505A, source/drain regions 504A formed in the fin 503A, a HKMG gate structure 506A laterally between the source/drain regions 504A, and gate spacers 507A on opposite sidewalls of the gate structure 506A. Example materials and fabrication of the substrate 501A, the fin 503A, the source/drain regions 504A, the STI region 505A, the gate structure 506A and the gate spacers 507A are similar to that of the FinFET 302A as discussed previously with respect to FIG. 3C, and thus are not repeated for the sake of brevity.

The IC structure 500A further includes an ILD layer 541A over the FinFETs 502A, and contacts 508A extending through the ILD layer 541A to land on gate structures 506A and/or source/drain regions 504A of the FinFEts 502A. Exemplary materials and fabrication of the ILD layer 541A and the contacts 508A are similar to that of the ILD layer 341A and contacts 308A as discussed previously with respect to FIG. 3C, and thus are not repeated for the sake of brevity.

The IC structure 500A further includes an interconnect structure 530A including multiple metallization layers M1A-M4A fabricated using the layout patterns of metallization layers M1-M4 of the layout 500 as illustrated in FIG. 5A, and thus the metallization layers M1A-M4A inherit geometries of the layout patterns of the metallization layers M1-M4 in the layout 500. The metallization layers M1A-M4A include IMD layers 551A-554A and 561A-564A, respectively. The IMD layers 561A-564A are formed over the corresponding IMD layers 551A-554A. The metallization layers M1A-M4A include horizontal interconnects, such as metal lines 511A-514A, respectively extending horizontally or laterally in the IMD layers 561A-564A and vertical interconnects, such as metal vias 521A-524A, respectively extending vertically in the IMD layers 551A-554A. Example materials and fabrication of the metallization layers M1A-M4A of the IC structure 500A are similar to that of the IC structure 300A as discussed previously with respect to FIG. 3C, and thus are not repeated for the sake of brevity.

The metal lines 511A-514A and metal vias 521A-524A have the same geometries as the corresponding metal lines 511-514 and metal vias 521-524 in the layout 500. In greater detail, the metal lines 511A, and 513A extend along a first direction (e.g., the X direction as illustrated in perspective view of FIG. 5A) and are spaced apart from each other along a second direction (e.g., the Y direction as illustrated in perspective view of FIG. 5A). The metal lines 512A and 514A extend along the second direction (Y direction as illustrated in FIG. 5A) and are spaced apart from each other along the first direction (X direction as illustrated in FIG. 5A). As a result, longitudinal directions of the metal lines 511A and 513A are perpendicular to longitudinal directions of the metal lines 512A and 514A.

Line widths W51, W53 of the metal lines 511A, 513A are less than the line widths W52, W54 of the metal lines 512A, 514A. The line-to-line spacings S51, S53 of the metal lines 511A, 513A are less than the line-to-line spacings S52, S54 of the metal lines 512A, 514A. As a result, the routing density of the metallization layer M1A is greater than that of the metallization layer M2A, which in turn helps to connect the scaled-down devices (e.g., transistors at 10, 7, 5 or 3 nm technology node) below the first metallization layer M1A. Moreover, because the line width W52 of metal lines 512A is greater than the line width W53 of metal lines 513A above the metal lines 512A, the metal lines 512A have a lower resistance than the metal lines 513A. In this way, longer nets (i.e., nets having greater total length of metal lines) can be routed on the metallization layer M2A to reduce the resistance of the longer nets, and shorter nets (i.e., nets having less total length of metal lines) can be routed on the metallization layer M3A.

Figure 6B:
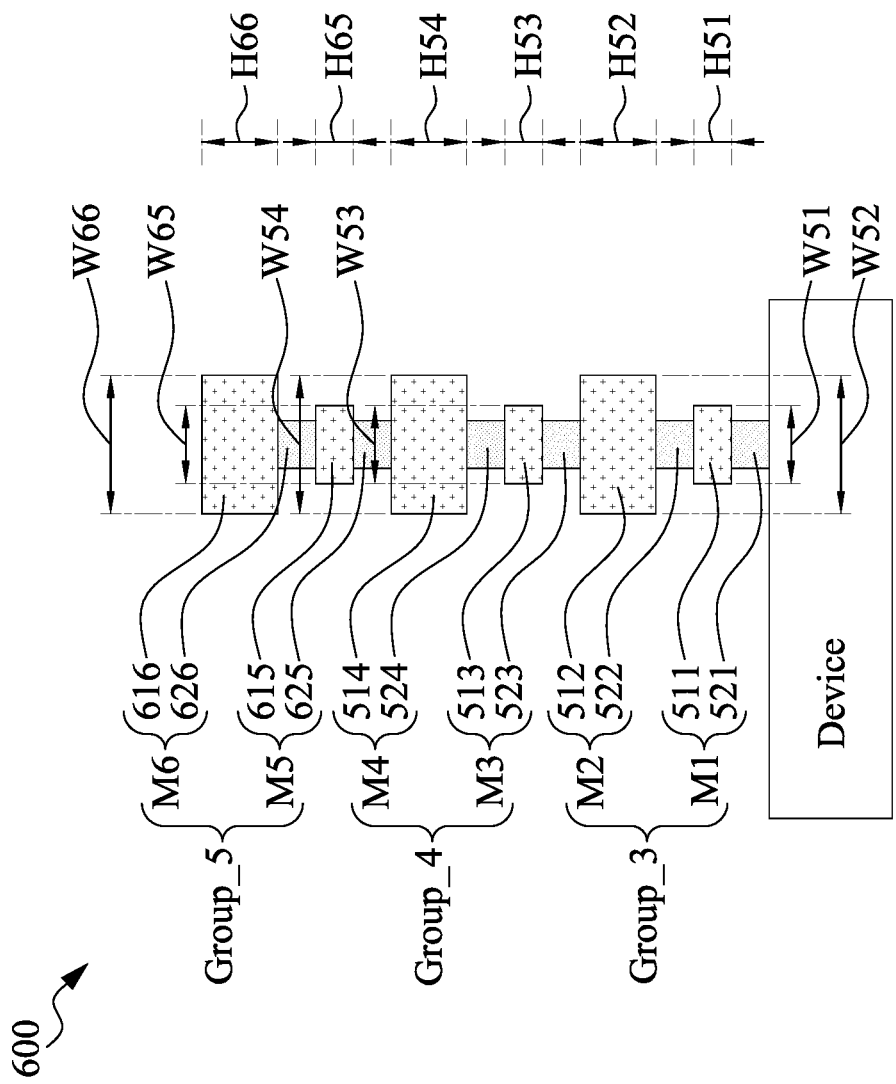
FIG. 6B is a schematic diagram illustrating a metal line width difference among metallization layers in the layout of FIG. 6A.
Figure 6C:
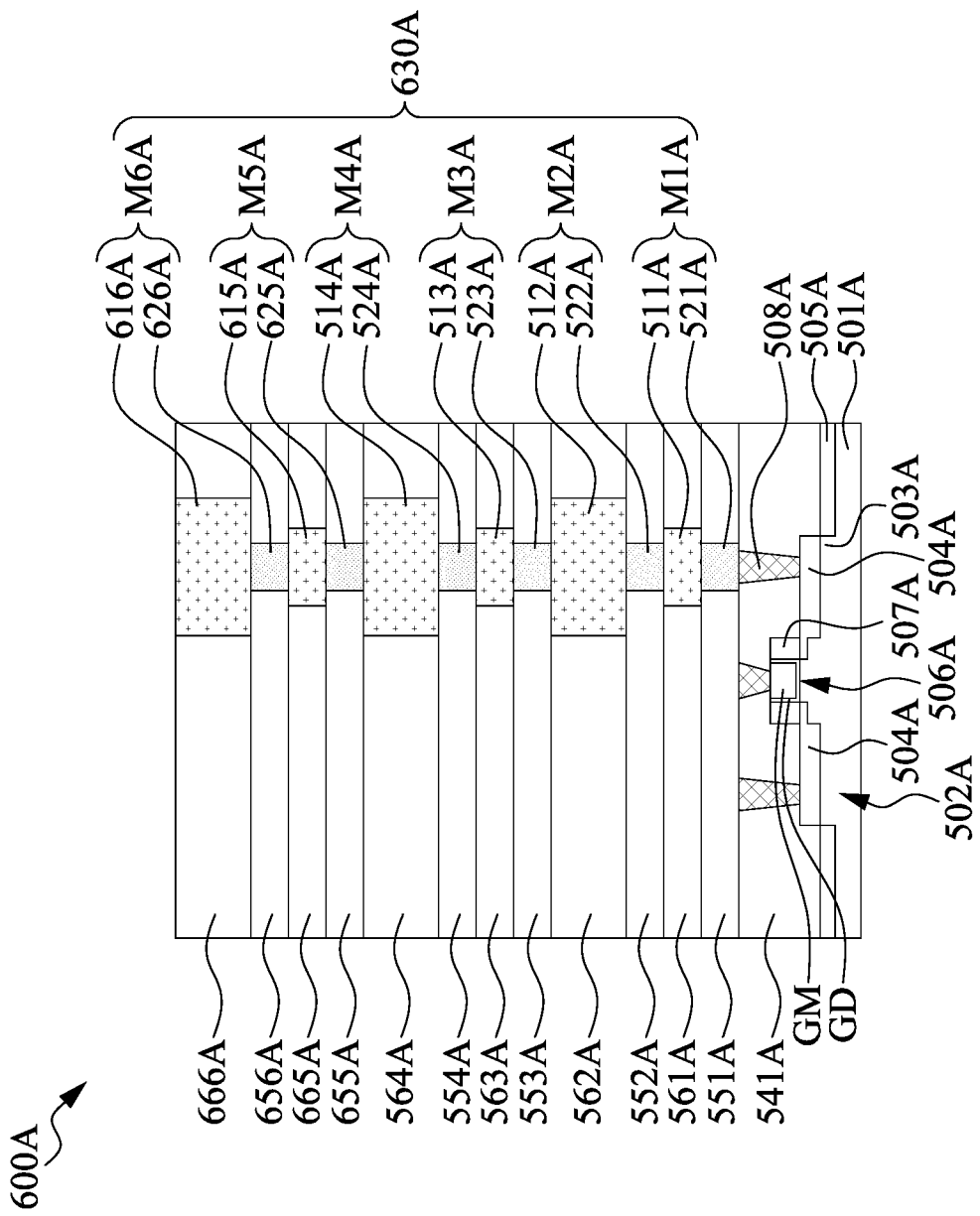
FIG. 6C is a cross-sectional view of an IC structure fabricated using the layout of FIG. 6A according to some embodiments of the present disclosure.

In FIGS. 5A-5C two same models are stacked together. However, there is no constraint for the repetition number of same models. For example, FIGS. 6A-6C illustrate three same models stacked together in a layout. FIG. 6A is a perspective view of a layout 600 including three same models stacked together in some embodiments of the present disclosure. FIG. 6B is a schematic diagram illustrating a metal line width difference among metallization layers in the layout of FIG. 6A. The layout 600 is usable to manufacture an IC structure 600A as illustrated in FIG. 6C.

Details of the models Group_3 and Group_4 in the layout 600 are discussed previously with respect to FIGS. 5A and 5B, and thus are not repeated for the sake of brevity. The layout 600 further includes a fifth grouped metallization layers model Group_5 stacked over the model Group_4 and having same dimension parameters as the models Group_3 and Group_4. For example, the model Group_5 includes only two metallization layers, e.g., a fifth metallization layer M5 and a sixth metallization layer M6 over the fifth metallization layer M5. The metallization layers M5-M6 include horizontal interconnects, such as metal lines 615-616 extending horizontally or laterally, and respective vertical interconnects, such as metal vias 625-626 respectively extending vertically. The metal lines 615 extend along the X direction and are spaced apart from each other along the Y direction, and thus the metal lines 615 run parallel with the metal lines 513 and 511 and perpendicular to metal lines 514 and 512. The metal lines 616 extend along the Y direction and are spaced apart from each other along the X direction, and thus the metal lines 616 run parallel with the metal lines 514 and 512 and perpendicular to metal lines 615, 513 and 511.

The metal lines 615 have a line width W65 measured in the Y direction and a line height H65 measured in the Y direction, and the metal lines 615 are arranged at a line-to-line spacing S65 measured in the Y direction. The line width W65, line height H65, and line-to-line spacing S65 of the metal lines 615 are respectively the same as the line width W53, the line height H53, and line-to-line spacing S53 of the metal lines 513, and also respectively the same as the line width W51, the line height H51 and line-to-line spacing S51 of the metal lines 511. The metal lines 616 have a line width W66 measured in the X direction and a line height H66 measured in the Z direction, and the metal lines 616 are arranged at a line-to-line spacing S66 measured in the X direction. The line width W66, line height H66 and line-to-line spacing S66 of the metal lines 616 are respectively the same as the line width W54, line height H54 and line-to-line spacing S54 of the metal lines 514, and also respectively the same as the corresponding line width W52, line height H52 and line-to-line spacing S52 of the metal lines 512. Therefore, the fifth grouped metallization layers model Group_5 has same dimension parameters as the models Group_3 and Group_4.

In greater detail, the line widths W51, W53, W65 of the metal lines 511, 513, 615 are less than the line widths W52, W54, W66 of the metal lines 512, 514, 616. The line-to-line spacings S51, S53, S65 of the metal lines 511, 513, 615 are less than the line-to-line spacings S52, S54, S66 of the metal lines 512, 514, 616. As a result, the metal lines 514 have a lower resistance than the metal lines 615. In this way, longer nets (i.e., nets having greater total length of metal lines) can be routed on the metallization layer M4 to reduce the resistance of the longer nets, and shorter nets (i.e., nets having less total length of metal lines) can be routed on the metallization layer M5.

FIG. 6C is a cross-sectional view of an IC structure 600A fabricated using the layout 600 according to some embodiments of the present disclosure, and thus the IC structure 600A inherits geometries of those patterns in the layout 600, as described in greater detail below. The IC structure 600A can be fabricated in fab at the stage 122 of the fabrication flow 100 as illustrated FIG. 1. The IC structure 600A is a non-limiting example for facilitating the illustration of the present disclosure.

The IC structure 600A is similar to the IC structure 500A, except that the interconnect structure 630A further includes a metallization layer M5A over the metallization layer M4A and a metallization layer M6A over the metallization layer M5A. The metallization layers M5A-M6A are fabricated using the layout patterns of metallization layers M5-M6 of the layout 600 as illustrated in FIG. 6A, and thus the metallization layers M5A-M6A inherit geometries of the layout patterns of the metallization layers M5-M6 in the layout 600. The metallization layers M5A-M6A include IMD layers 655A-656A and 665A-666A, respectively. The IMD layers 665A-666A are formed over the corresponding IMD layers 655A-656A. The metallization layers M5A-M6A include horizontal interconnects, such as metal lines 615A-616A, respectively extending horizontally or laterally in the IMD layers 665A-666A and vertical interconnects, such as metal vias 625A-626A, respectively extending vertically in the IMD layers 655A-656A. Example materials and fabrication of the metallization layers M5A-M6A of the IC structure 600A are similar to that of the IC structure 300A as discussed previously with respect to FIG. 3C, and thus are not repeated for the sake of brevity.

The metal lines 615A-616A and metal vias 625A-626A have the same geometries as the corresponding metal lines 615-616 and metal vias 625-626 in the layout 500, and thus are not repeated for the sake of brevity. Metallization layers M1A-M4A are the same as that of the IC structure 500A as discussed previously with respect to FIG. 5C, and thus are not repeated for the sake of brevity.

Figure 7A:
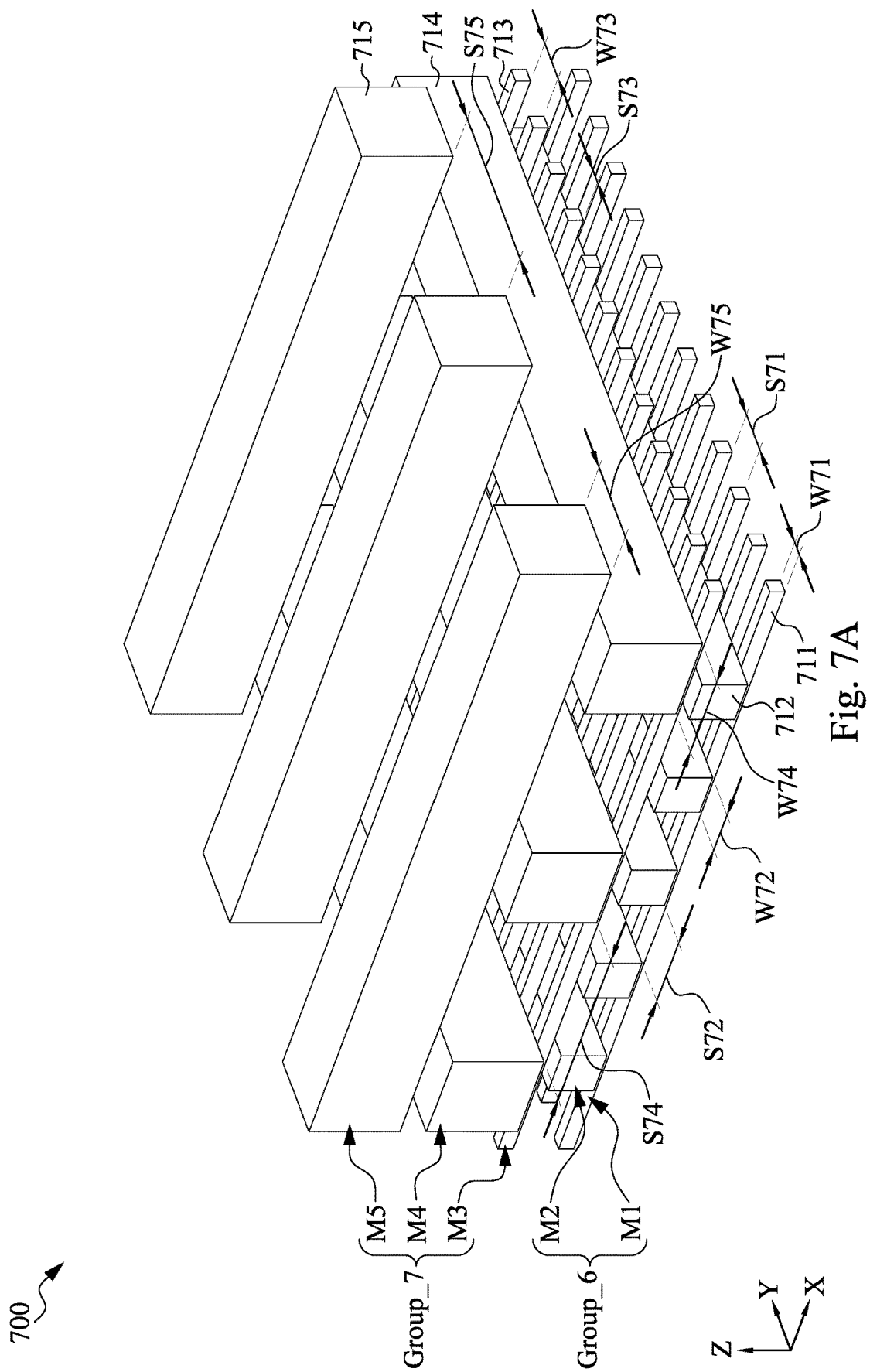
FIG. 7A is a perspective view of a layout including exemplary models of grouped metallization layers in some embodiments of the present disclosure.
Figure 7B:
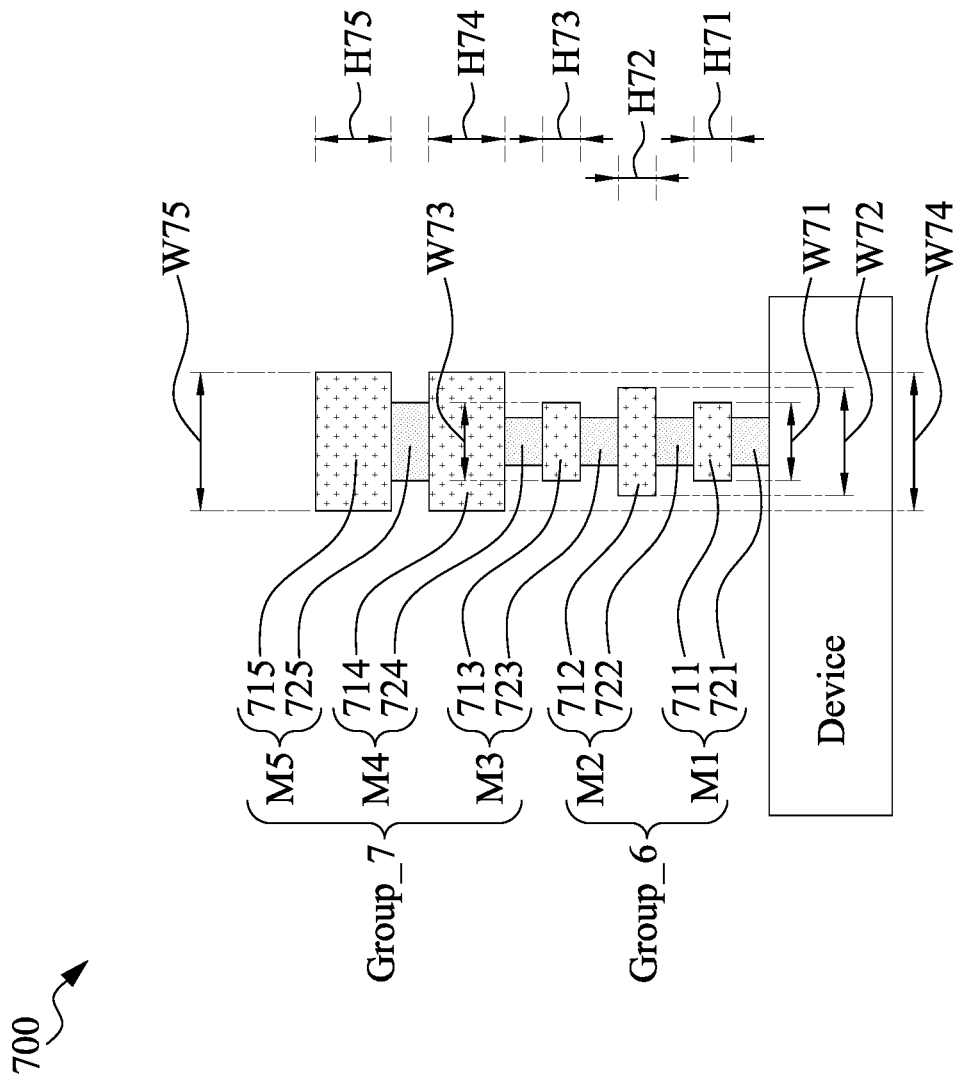
FIG. 7B is a schematic diagram illustrating a metal line width difference among metallization layers in the layout of FIG. 7A.
Figure 7C:
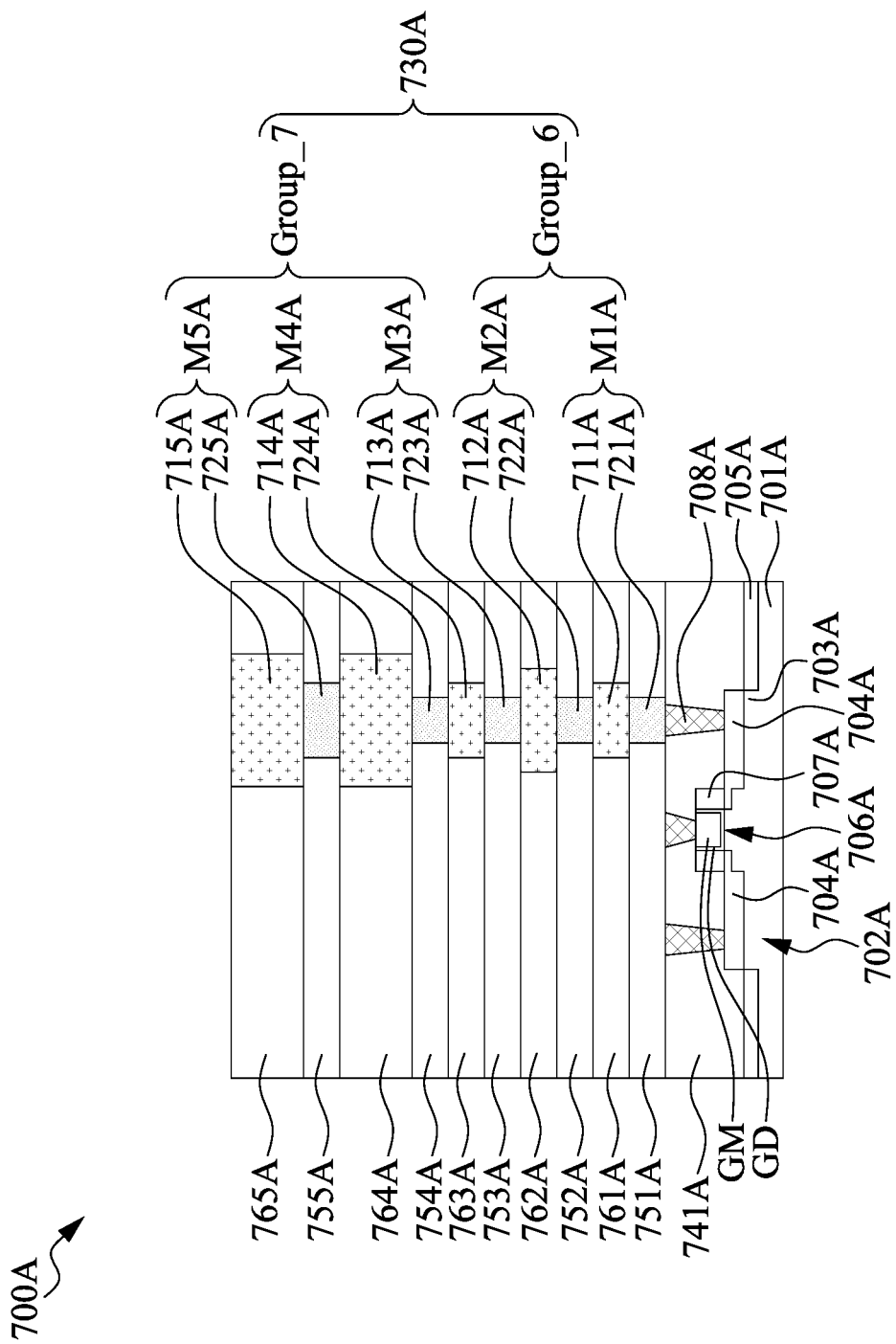
FIG. 7C is a cross-sectional view of an IC structure fabricated using the layout of FIG. 7A according to some embodiments of the present disclosure.

In some embodiments, different models have different numbers of metallization layers, as illustrated in FIGS. 7A-7C. FIG. 7A is a perspective view of a layout 700 including exemplary models of grouped metal layers in some embodiments of the present disclosure. FIG. 7B is a schematic diagram illustrating a metal line width difference among metallization layers in the layout of FIG. 7A. The layout 700 is usable to manufacture an IC structure 700A as illustrated in FIG. 7C.

The layout 700 includes a sixth grouped metallization layers model Group_6 and a seventh grouped metallization layers model Group_7 stacked over the sixth grouped metallization layers model Group_6. The models Group_6 and Group_7 are defined in the libraries 208 and different at least in the number of metallization layers. For example, the model Group_6 includes only two metallization layers, e.g., a first metallization layer M1 and a second metallization layer M2 over the first metallization layer M1, but the model Group_7 includes three metallization layers, e.g., a third metallization layer M3 over second metallization layer M2, and a fourth metallization layer M4 over the third metallization layer M3, and a fifth metallization layer M5 over the fourth metallization layer M4.

The metallization layers M1-M5 include horizontal interconnects, such as metal lines 711-715 extending horizontally or laterally, and respective vertical interconnects, such as metal vias 721-725 respectively extending vertically. The metal lines 711, 713 and 715 extend along a first direction (e.g., the X direction as illustrated in perspective view of FIG. 7A) and are spaced apart from each other along a second direction (e.g., the Y direction as illustrated in perspective view of FIG. 7A). The metal lines 712 and 714 extend along the second direction (Y direction as illustrated in FIG. 7A) and are spaced apart from each other along the first direction (X direction as illustrated in FIG. 7A). As a result, longitudinal directions of the metal lines 711, 713 and 715 are perpendicular to longitudinal directions of the metal lines 712 and 714.

The metal lines 711, 713, 715 have corresponding line widths W71, W73, W75 measured in the Y direction, and are arranged at corresponding line-to-line spacings S71, S73, S75 measured in the Y direction. The metal lines 712, 714 have corresponding line widths W72, W74 measured in the X direction, and are arranged at corresponding line-to-line spacings S72, S74 measured in the X direction. The line widths W71, W73 of the metal lines 711, 713 are less than the line widths W72, W74 of the metal lines 712, 714. The line-to-line spacings S71, S73 of the metal lines 711, 713 are less than the line-to-line spacings S72, S74 of the metal lines 712, 714. As a result, the routing density of the metallization layer M1 is greater than that of the metallization layer M2, which in turn helps to connect the scaled-down devices (e.g., transistors at 10, 7, 7 or 3 nm technology node) below the first metallization layer M1. Moreover, because the line width W72 of metal lines 712 is greater than the line width W73 of metal lines 713 above the metal lines 712, the metal lines 712 have a lower resistance than the metal lines 713. In this way, longer nets (i.e., nets having greater total length of metal lines) can be routed on the metallization layer M2 to reduce the resistance of the longer nets, and shorter nets (i.e., nets having less total length of metal lines) can be routed on the metallization layer M3. In some embodiments, the line width W75 and the line-to-line spacing S75 of the metal lines 715 are respectively the same as the line width W74 and the line-to-line spacing S74 of the metal lines 714. By way of example and not limitation, the line widths of metal lines 711-715 may satisfy the relation W71=W73<W72<W74=W75, and the line-to-line spacings of metal lines 711-715 may satisfy the relation S71=S73<S72<S74=S75.

In some embodiments, by way of example and not limitation, the line heights H71, H72, H73 of the metal lines 711, 712, 713 (which is measured in the Z direction perpendicular to the X-Y plane as illustrated in FIG. 7A) is less than the line heights H74, H75 of the metal lines 714, 715. In some embodiments, by way of example and not limitation, the line heights H71, H72, H73 of the metal lines 711, 712, 713 are less than the via heights of the vias 721-725, but the line heights H74, H75 of the metal lines 714, 715 are greater than the via heights of the vias 721-725. By way of example and not limitation, the line heights of metal lines 711-715 may satisfy the relation H71=H72=H73<H74=H75 or H71=H73<H72<H74=H75.

FIG. 7C is a cross-sectional view of an IC structure 700A fabricated using the layout 700 according to some embodiments of the present disclosure, and thus the IC structure 700A inherits geometries of those patterns in the layout 700, as described in greater detail below. The IC structure 700A can be fabricated in fab at the stage 122 of the fabrication flow 100 as illustrated FIG. 1. The IC structure 700A is a non-limiting example for facilitating the illustration of the present disclosure.

The IC structure 700A includes a device 702A which may be a FinFET including a fin 703A protruding from substrate 701A and having lower portions laterally surrounded by STI regions 705A, source/drain regions 704A formed in the fin 703A, a HKMG gate structure 706A laterally between the source/drain regions 704A, and gate spacers 707A on opposite sidewalls of the gate structure 706A. Example materials and fabrication of the substrate 701A, the fin 703A, the source/drain regions 704A, the STI region 705A, the gate structure 706A and the gate spacers 707A are similar to that of the FinFET 302A as discussed previously with respect to FIG. 3C, and thus are not repeated for the sake of brevity.

The IC structure 700A further includes an ILD layer 741A over the FinFETs 702A, and contacts 708A extending through the ILD layer 741A to land on gate structures 706A and/or source/drain regions 704A of the FinFEts 702A. Exemplary materials and fabrication of the ILD layer 741A and the contacts 708A are similar to that of the ILD layer 341A and contacts 308A as discussed previously with respect to FIG. 3C, and thus are not repeated for the sake of brevity.

The IC structure 700A further includes an interconnect structure 730A including multiple metallization layers M1A-M5A fabricated using the layout patterns of metallization layers M1-M5 of the layout 700 as illustrated in FIG. 7A, and thus the metallization layers M1A-M5A inherit geometries of the layout patterns of the metallization layers M1-M4 in the layout 700. The metallization layers M1A-M5A include IMD layers 751A-755A and 761A-765A, respectively. The IMD layers 761A-765A are formed over the corresponding IMD layers 751A-755A. The metallization layers M1A-M5A include horizontal interconnects, such as metal lines 711A-715A, respectively extending horizontally or laterally in the IMD layers 761A-765A and vertical interconnects, such as metal vias 721A-725A, respectively extending vertically in the IMD layers 751A-755A. Example materials and fabrication of the metallization layers M1A-M5A of the IC structure 700A are similar to that of the IC structure 300A as discussed previously with respect to FIG. 3C, and thus are not repeated for the sake of brevity. The metal lines 711A-715A and metal vias 721A-725A have the same geometries as the corresponding metal lines 711-715 and metal vias 721-725 in the layout 700, and thus are not repeated for the sake of brevity.

Figure 8A:
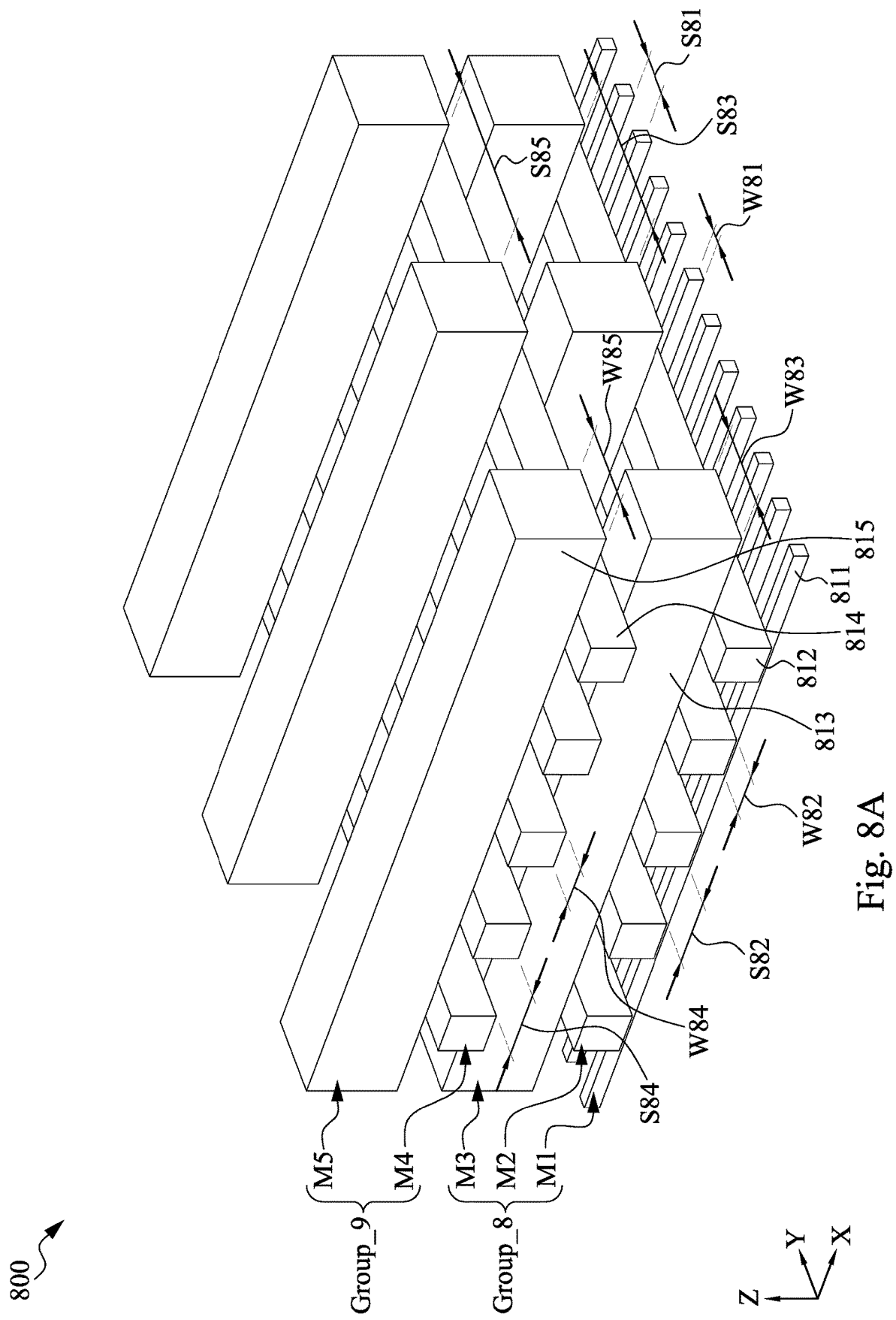
FIG. 8A is a perspective view of a layout including exemplary models of grouped metallization layers in some embodiments of the present disclosure.
Figure 8B:
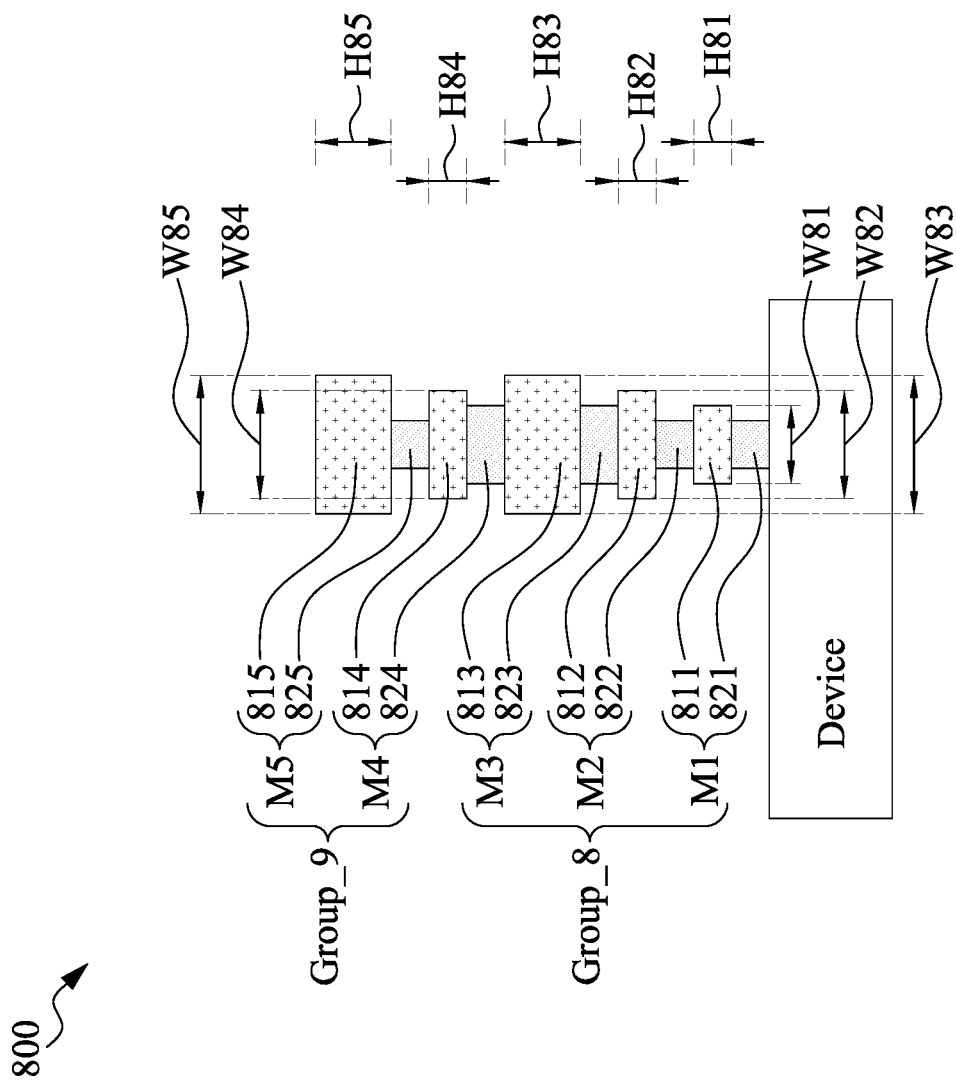
FIG. 8B is a schematic diagram illustrating a metal line width difference among metallization layers in the layout of FIG. 8A.

FIG. 8A is a perspective view of a layout 800 including exemplary models of grouped metal layers in some embodiments of the present disclosure. FIG. 8B is a schematic diagram illustrating a metal line width difference among metallization layers in the layout of FIG. 8A. The layout 800 is usable to manufacture an IC structure 800A as illustrated in FIG. 8C.

The layout 800 includes an eighth grouped metallization layers model Group_8 and a ninth grouped metallization layers model Group_9 stacked over the eighth grouped metallization layers model Group_8. The models Group_8 and Group_9 are defined in the libraries 208 and different at least in the number of metallization layers. For example, the model Group_8 includes three metallization layers, e.g., a first metallization layer M1, a second metallization layer M2 over the first metallization layer M1 and a third metallization layer M3 over the second metallization layer M2, but the model Group_9 includes only two metallization layers, e.g., a fourth metallization layer M4 over the third metallization layer M3, and a fifth metallization layer M5 over the fourth metallization layer M4.

The metallization layers M1-M5 include horizontal interconnects, such as metal lines 811-815 extending horizontally or laterally, and respective vertical interconnects, such as metal vias 821-825 respectively extending vertically. The metal lines 811, 813 and 815 extend along a first direction (e.g., the X direction as illustrated in perspective view of FIG. 8A) and are spaced apart from each other along a second direction (e.g., the Y direction as illustrated in perspective view of FIG. 8A). The metal lines 812 and 814 extend along the second direction (Y direction as illustrated in FIG. 8A) and are spaced apart from each other along the first direction (X direction as illustrated in FIG. 8A). As a result, longitudinal directions of the metal lines 811, 813 and 815 are perpendicular to longitudinal directions of the metal lines 812 and 814.

The metal lines 811, 813, 815 have corresponding line widths W81, W83, W85 measured in the Y direction, and are arranged at corresponding line-to-line spacings S81, S83, S85 measured in the Y direction. The metal lines 812, 814 have corresponding line widths W82, W84 measured in the X direction, and are arranged at corresponding line-to-line spacings S82, S84 measured in the X direction. The line widths W81, W82, W84 of the metal lines 811, 812, 814 are less than the line widths W83, W85 of the metal lines 813, 815. The line-to-line spacings S81, S82, S84 of the metal lines 811, 812, 814 are less than the line-to-line spacings S83, S85 of the metal lines 813, 815. As a result, the routing density of the metallization layer M1 is greater than that of the metallization layer M3, which in turn helps to connect the scaled-down devices (e.g., transistors at 10, 8, 8 or 3 nm technology node) below the first metallization layer M1. Moreover, because the line width W83 of metal lines 813 is greater than the line width W84 of metal lines 814 above the metal lines 813, the metal lines 813 have a lower resistance than the metal lines 814. In this way, longer nets (i.e., nets having greater total length of metal lines) can be routed on the metallization layer M3 to reduce the resistance of the longer nets, and shorter nets (i.e., nets having less total length of metal lines) can be routed on the metallization layer M4. By way of example and not limitation, the line widths of metal lines 811-815 may satisfy the relation W81<W82=W84<W83=W85, and the line-to-line spacings of metal lines 811-815 may satisfy the relation S81<S82=S84<S83=S85.

In some embodiments, by way of example and not limitation, the line heights H81, H82, H84 of the metal lines 811, 812, 814 (which is measured in the Z direction perpendicular to the X-Y plane as illustrated in FIG. 8A) is less than the line heights H83, H85 of the metal lines 813, 815. In some embodiments, by way of example and not limitation, the line heights H81, H82, H84 of the metal lines 811, 812, 814 are less than the via heights of the vias 821-825, but the line heights H83, H85 of the metal lines 813, 815 are greater than the via heights of the vias 821-825. By way of example and not limitation, the line heights of metal lines 811-815 may satisfy the relation H81=H82=H84<H83=H85 or H81<H82=H84<H83=H85.

FIG. 8C is a cross-sectional view of an IC structure 800A fabricated using the layout 800 according to some embodiments of the present disclosure, and thus the IC structure 800A inherits geometries of those patterns in the layout 800, as described in greater detail below. The IC structure 800A can be fabricated in fab at the stage 122 of the fabrication flow 100 as illustrated FIG. 1. The IC structure 800A is a non-limiting example for facilitating the illustration of the present disclosure.

The IC structure 800A includes a device 802A which may be a FinFET including a fin 803A protruding from substrate 801A and having lower portions laterally surrounded by STI regions 805A, source/drain regions 804A formed in the fin 803A, a HKMG gate structure 806A laterally between the source/drain regions 804A, and gate spacers 807A on opposite sidewalls of the gate structure 806A. Example materials and fabrication of the substrate 801A, the fin 803A, the source/drain regions 804A, the STI region 805A, the gate structure 806A and the gate spacers 807A are similar to that of the FinFET 302A as discussed previously with respect to FIG. 3C, and thus are not repeated for the sake of brevity.

The IC structure 800A further includes an ILD layer 841A over the FinFETs 802A, and contacts 808A extending through the ILD layer 841A to land on gate structures 806A and/or source/drain regions 804A of the FinFEts 802A. Exemplary materials and fabrication of the ILD layer 841A and the contacts 808A are similar to that of the ILD layer 341A and contacts 308A as discussed previously with respect to FIG. 3C, and thus are not repeated for the sake of brevity.

The IC structure 800A further includes an interconnect structure 830A including multiple metallization layers M1A-M5A fabricated using the layout patterns of metallization layers M1-M5 of the layout 800 as illustrated in FIG. 8A, and thus the metallization layers M1A-M5A inherit geometries of the layout patterns of the metallization layers M1-M5 in the layout 800. The metallization layers M1A-M5A include IMD layers 851A-855A and 861A-865A, respectively. The IMD layers 861A-865A are formed over the corresponding IMD layers 851A-855A. The metallization layers M1A-M5A include horizontal interconnects, such as metal lines 811A-815A, respectively extending horizontally or laterally in the IMD layers 861A-865A and vertical interconnects, such as metal vias 821A-825A, respectively extending vertically in the IMD layers 851A-855A. Example materials and fabrication of the metallization layers M1A-M5A of the IC structure 800A are similar to that of the IC structure 300A as discussed previously with respect to FIG. 3C, and thus are not repeated for the sake of brevity. The metal lines 811A-815A and metal vias 821A-825A have the same geometries as the corresponding metal lines 811-815 and metal vias 821-825 in the layout 800, and thus are not repeated for the sake of brevity.

Figure 9A:
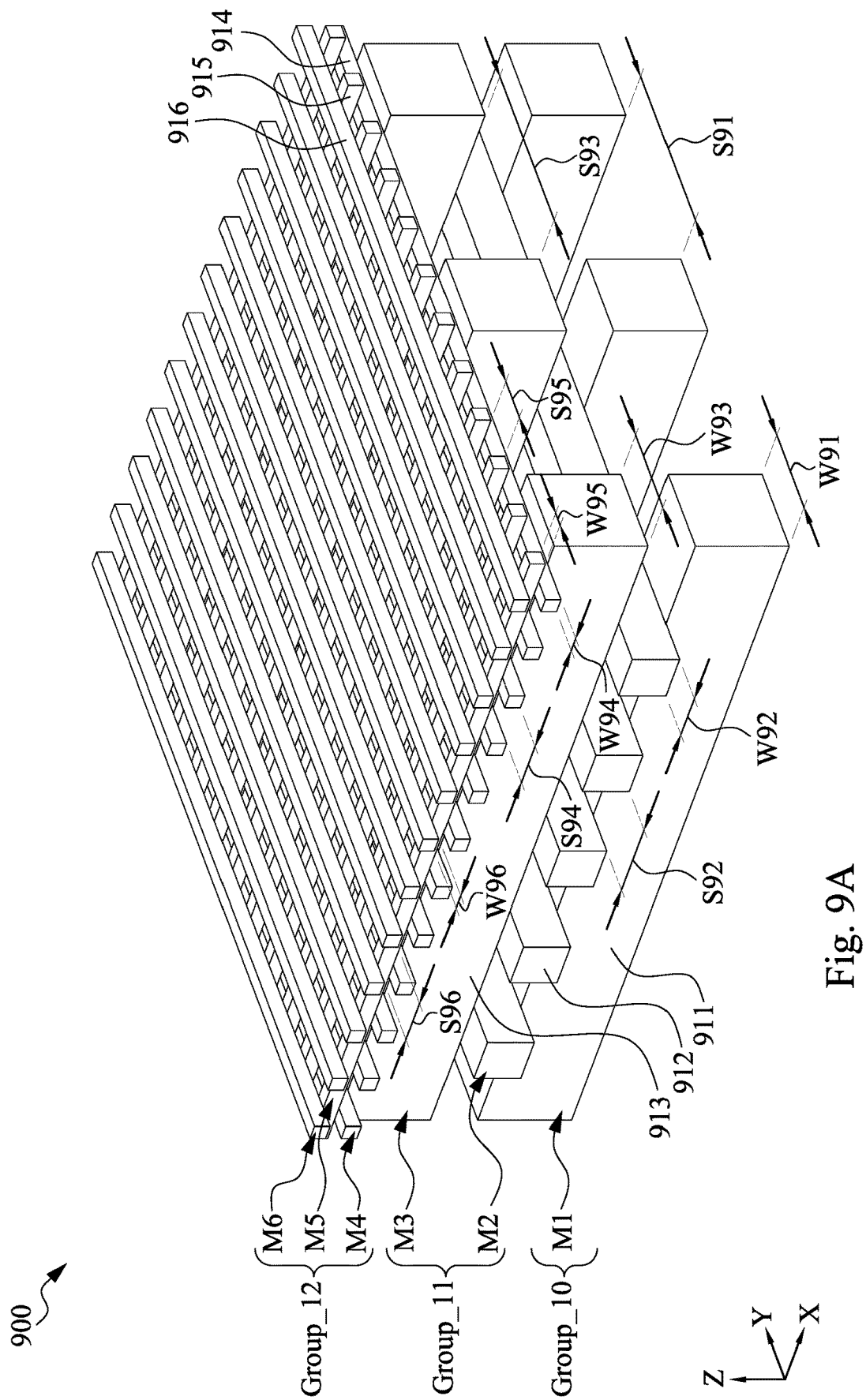
FIG. 9A is a perspective view of a layout including exemplary models of grouped metallization layers in some embodiments of the present disclosure.
Figure 9B:
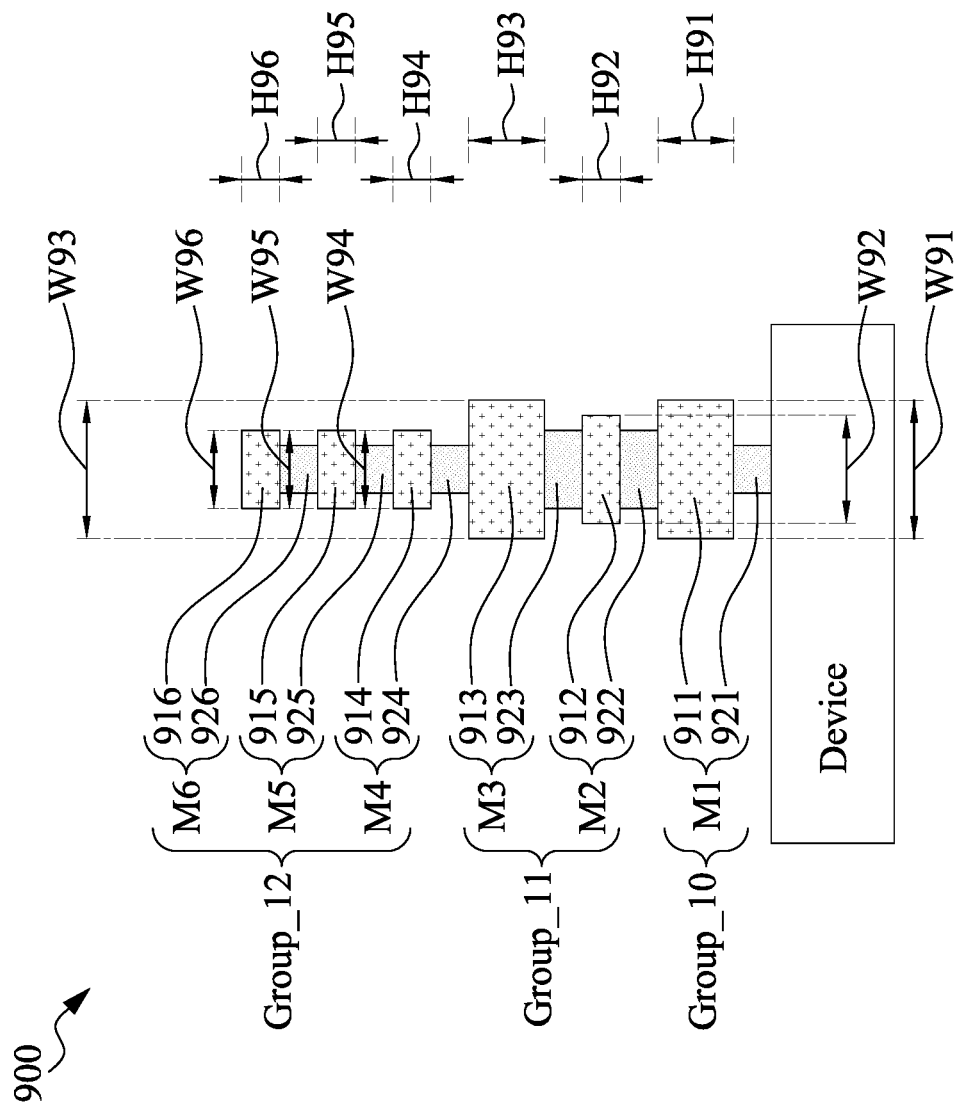
FIG. 9B is a schematic diagram illustrating a metal line width difference among metallization layers in the layout of FIG. 9A.
Figure 9C:
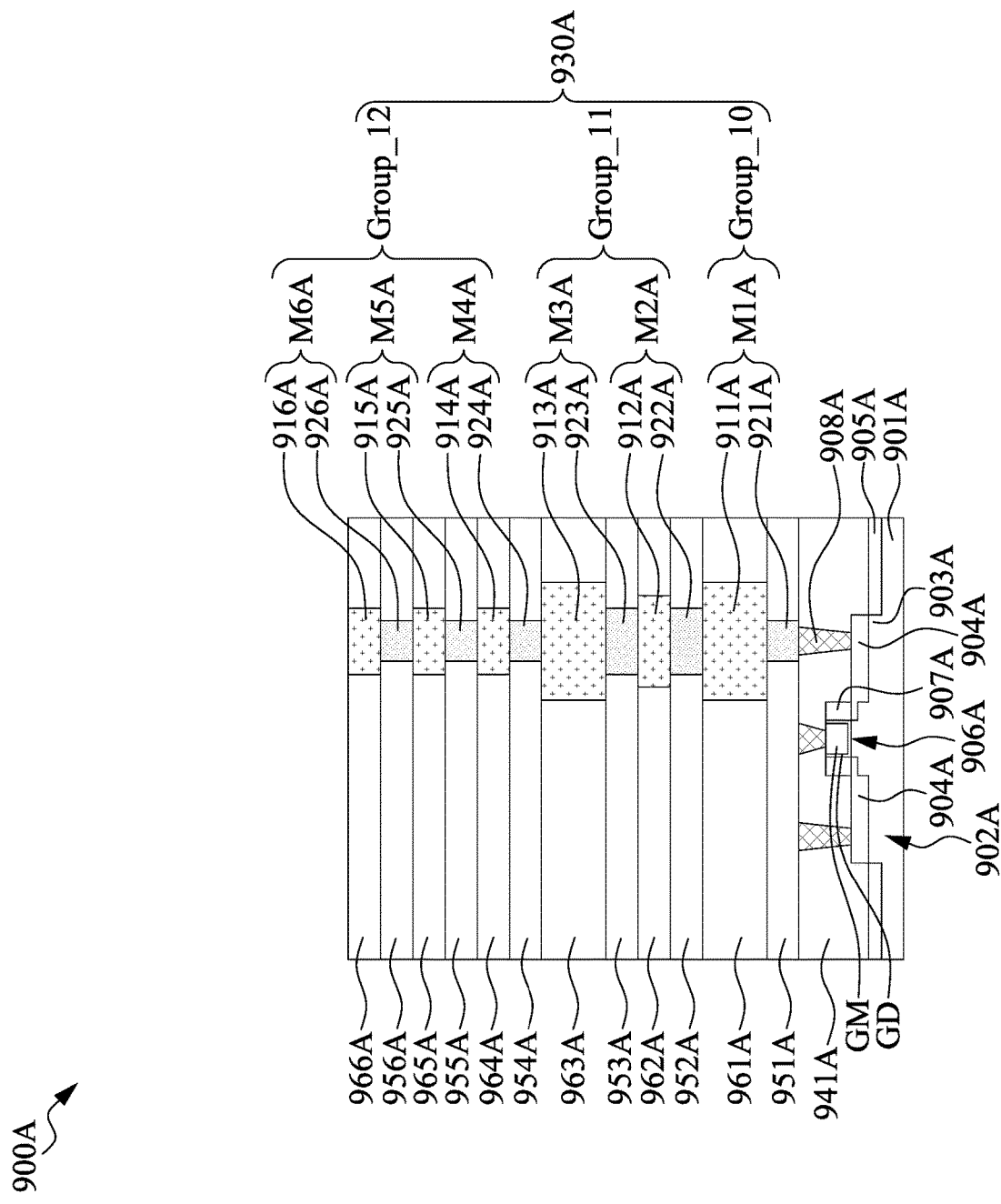
FIG. 9C is a cross-sectional view of an IC structure fabricated using the layout of FIG. 9A according to some embodiments of the present disclosure.

FIG. 9A is a perspective view of a layout 900 including exemplary models of grouped metal layers in some embodiments of the present disclosure. FIG. 9B is a schematic diagram illustrating a metal line width difference among metallization layers in the layout of FIG. 9A. The layout 900 is usable to manufacture an IC structure 900A as illustrated in FIG. 9C.

The layout 900 includes a tenth grouped metallization layers model Group_10, an eleventh grouped metallization layers model Group_11 stacked over the tenth grouped metallization layers model Group_10, and a twelfth grouped metallization layers model Group_12 stacked over the eleventh grouped metallization layers model Group_11. The models Group_10, Group_11 and Group_12 are defined in the libraries 209 and different at least in the number of metallization layers. For example, the model Group_10 includes one metallization layer M1, the model Group_11 includes two metallization layers, e.g., a second metallization layer M2 over the first metallization layer, and a third metallization layer M3 over the second metallization layer M2, and the model Group_12 includes three metallization layers, e.g., a fourth metallization layer M4 over the third metallization layer M3, a fifth metallization layer M5 over the fourth metallization layer M4, and a sixth metallization layer M6 over the fifth metallization layer M5.

The metallization layers M1-M6 include horizontal interconnects, such as metal lines 911-916 extending horizontally or laterally, and respective vertical interconnects, such as metal vias 921-926 respectively extending vertically. The metal lines 911, 913 and 915 extend along a first direction (e.g., the X direction as illustrated in perspective view of FIG. 9A) and are spaced apart from each other along a second direction (e.g., the Y direction as illustrated in perspective view of FIG. 9A). The metal lines 912, 914 and 916 extend along the second direction (Y direction as illustrated in FIG. 9A) and are spaced apart from each other along the first direction (X direction as illustrated in FIG. 9A). As a result, longitudinal directions of the metal lines 911, 913 and 915 are perpendicular to longitudinal directions of the metal lines 912, 914 and 916.

The metal lines 911, 913, 915 have corresponding line widths W91, W93, W95 measured in the Y direction and line heights H91, H93, H95 measured in the Z direction, and are arranged at corresponding line-to-line spacings S91, S93, S95 measured in the Y direction. The metal lines 912, 914, 916 have corresponding line widths W92, W94, W96 measured in the X direction and line heights H92, H94, H96 measured in the Z direction, and are arranged at corresponding line-to-line spacings S92, S94, S96 measured in the X direction. By way of example and not limitation, the line widths of metal lines 911-916 may satisfy the relation W94=W95=W96<W92<W91=W93, the line-to-line spacings of metal lines 911-916 may satisfy the relation S94=S95=S96<S92<S91=S93, and the line heights of metal lines 911-916 may satisfy the relation H94=H95=H96=H92<H91=H93 or H94=H95=H96<H92<H91=H93.

Because the line width W93 of metal lines 913 is greater than the line width W94 of metal lines 914 above the metal lines 913, the metal lines 913 have a lower resistance than the metal lines 914. In this way, longer nets (i.e., nets having greater total length of metal lines) can be routed on the metallization layer M3 to reduce the resistance of the longer nets, and shorter nets (i.e., nets having less total length of metal lines) can be routed on the metallization layer M4.

FIG. 9C is a cross-sectional view of an IC structure 900A fabricated using the layout 900 according to some embodiments of the present disclosure, and thus the IC structure 900A inherits geometries of those patterns in the layout 900, as described in greater detail below. The IC structure 900A can be fabricated in fab at the stage 122 of the fabrication flow 100 as illustrated FIG. 1. The IC structure 900A is a non-limiting example for facilitating the illustration of the present disclosure.

The IC structure 900A includes a device 902A which may be a FinFET including a fin 903A protruding from substrate 901A and having lower portions laterally surrounded by STI regions 905A, source/drain regions 904A formed in the fin 903A, a HKMG gate structure 906A laterally between the source/drain regions 904A, and gate spacers 907A on opposite sidewalls of the gate structure 906A. Example materials and fabrication of the substrate 901A, the fin 903A, the source/drain regions 904A, the STI region 905A, the gate structure 906A and the gate spacers 907A are similar to that of the FinFET 302A as discussed previously with respect to FIG. 3C, and thus are not repeated for the sake of brevity.

The IC structure 900A further includes an ILD layer 941A over the FinFETs 902A, and contacts 908A extending through the ILD layer 941A to land on gate structures 906A and/or source/drain regions 904A of the FinFEts 902A. Exemplary materials and fabrication of the ILD layer 941A and the contacts 908A are similar to that of the ILD layer 341A and contacts 308A as discussed previously with respect to FIG. 3C, and thus are not repeated for the sake of brevity.

The IC structure 900A further includes an interconnect structure 930A including multiple metallization layers M1A-M6A fabricated using the layout patterns of metallization layers M1-M6 of the layout 900 as illustrated in FIG. 9A, and thus the metallization layers M1A-M6A inherit geometries of the layout patterns of the metallization layers M1-M6 in the layout 900. The metallization layers M1A-M6A include IMD layers 951A-956A and 961A-966A, respectively. The IMD layers 961A-966A are formed over the corresponding IMD layers 951A-956A. The metallization layers M1A-M6A include horizontal interconnects, such as metal lines 911A-916A, respectively extending horizontally or laterally in the IMD layers 961A-966A and vertical interconnects, such as metal vias 921A-926A, respectively extending vertically in the IMD layers 951A-956A. Example materials and fabrication of the metallization layers M1A-M6A of the IC structure 900A are similar to that of the IC structure 300A as discussed previously with respect to FIG. 3C, and thus are not repeated for the sake of brevity. The metal lines 911A-916A and metal vias 921A-926A have the same geometries as the corresponding metal lines 911-916 and metal vias 921-926 in the layout 900, and thus are not repeated for the sake of brevity.

Figure 10A:
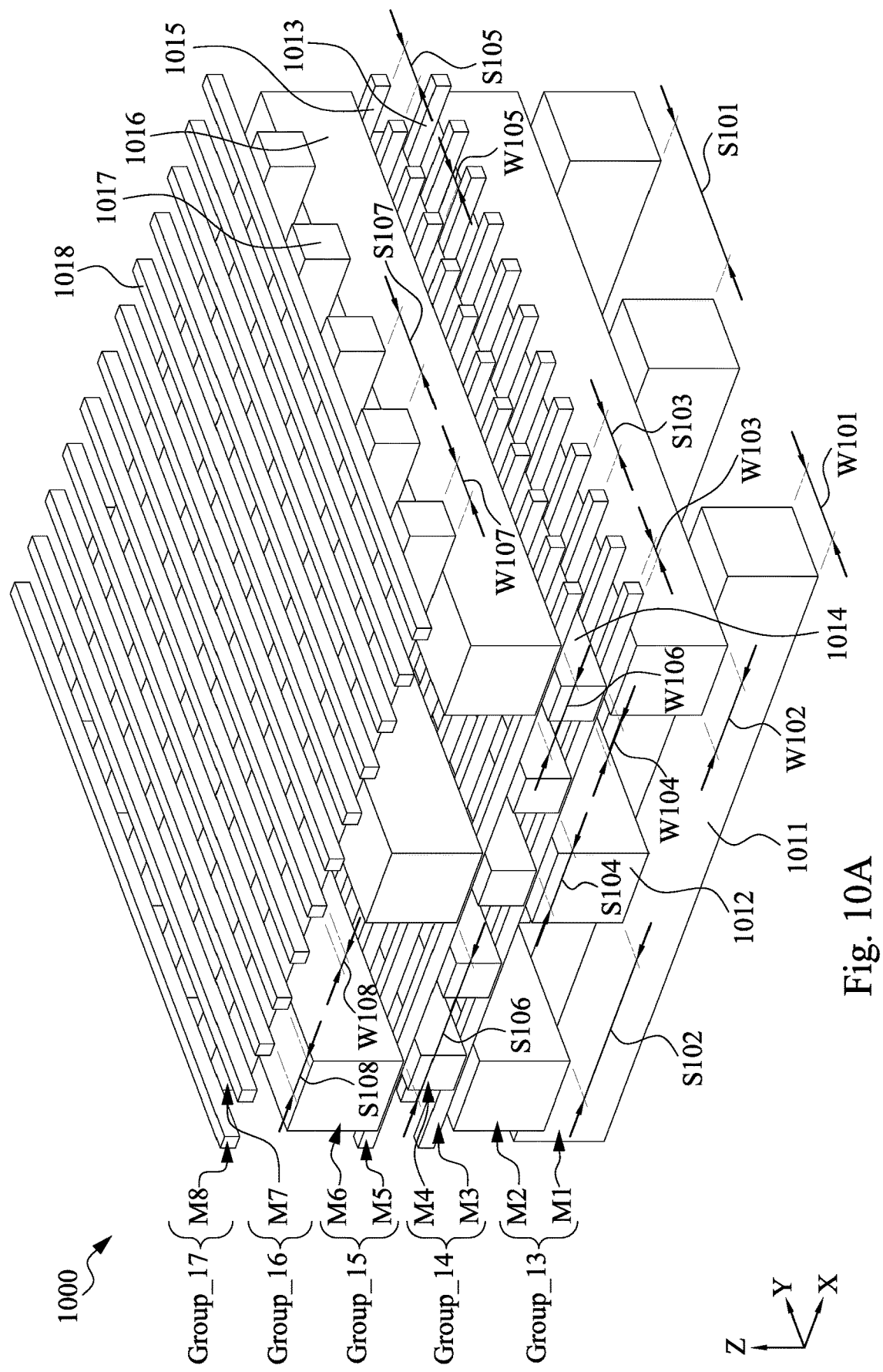
FIG. 10A is a perspective view of a layout including exemplary models of grouped metallization layers in some embodiments of the present disclosure.
Figure 10B:
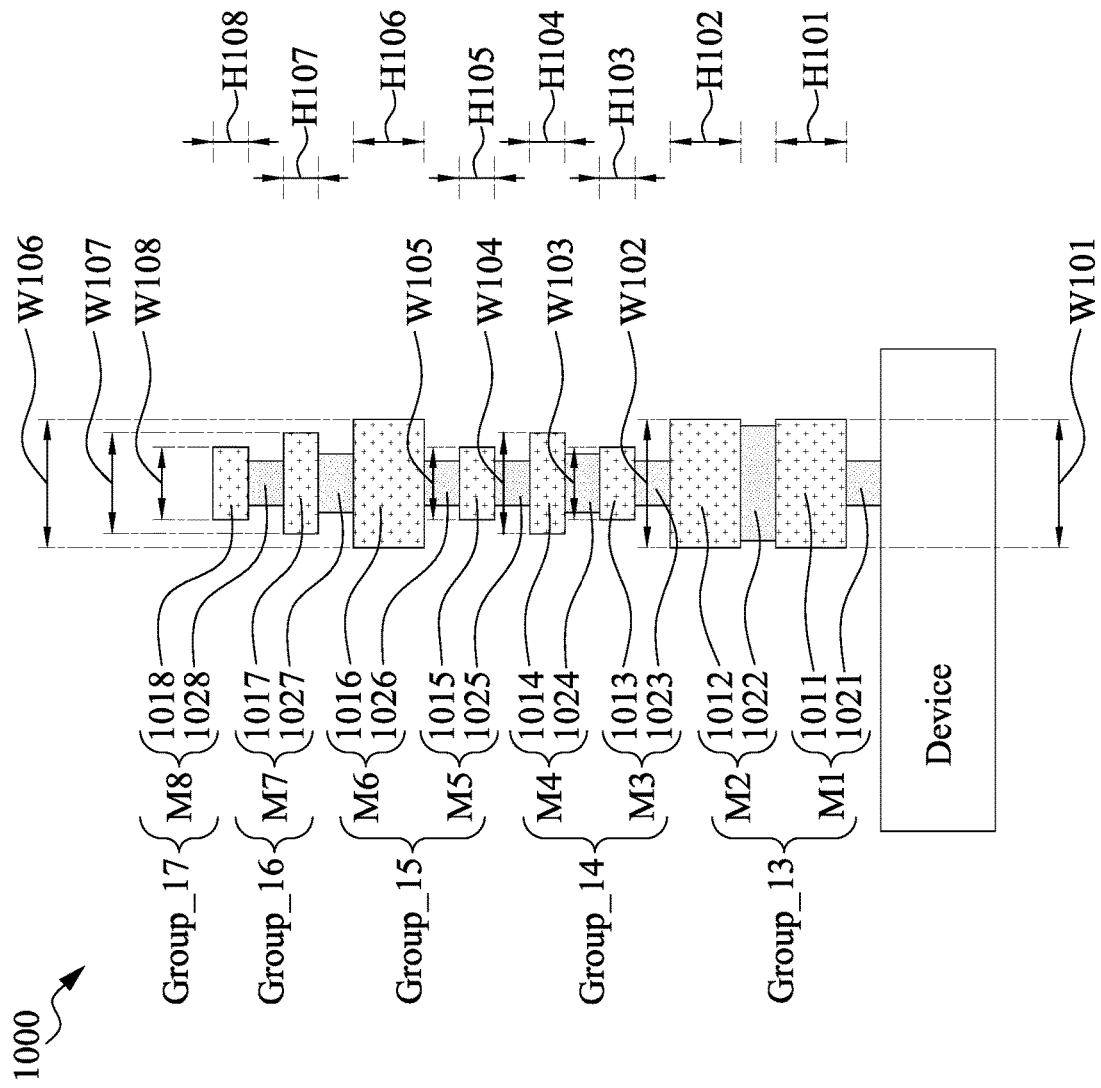
FIG. 10B is a schematic diagram illustrating a metal line width difference among metallization layers in the layout of FIG. 10A.
Figure 10C:
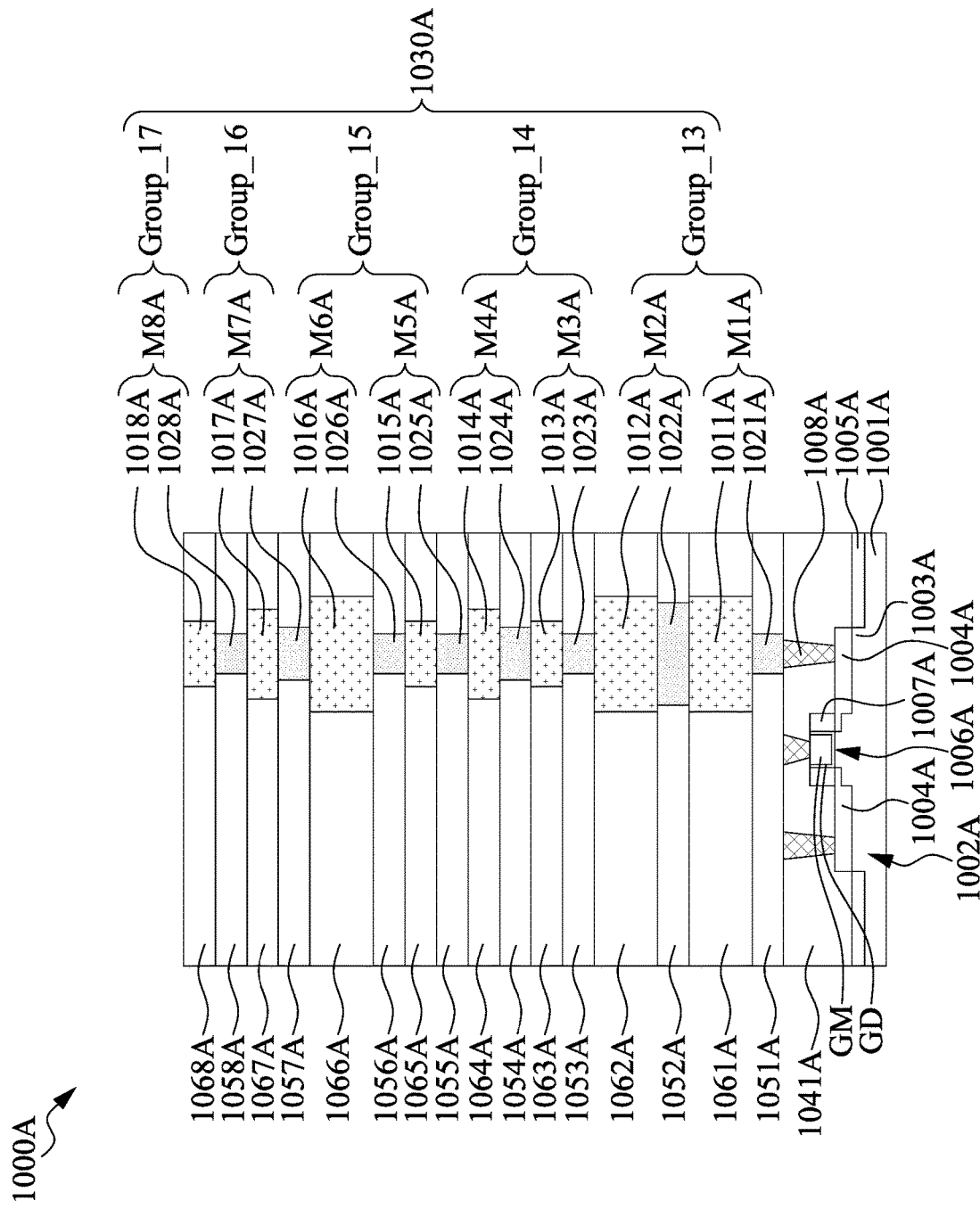
FIG. 10C is a cross-sectional view of an IC structure fabricated using the layout of FIG. 10A according to some embodiments of the present disclosure.

FIG. 10A is a perspective view of a layout 1000 including more exemplary models of grouped metal layers in some embodiments of the present disclosure. FIG. 10B is a schematic diagram illustrating a metal line width difference among metallization layers in the layout of FIG. 10A. The layout 1000 is usable to manufacture an IC structure 1000A as illustrated in FIG. 10C.

The layout 1000 includes thirteenth, fourteenth, fifteenth, sixteenth and seventeenth grouped metallization layers models Group_13, Group_14, Group_15, Group_16, and Group_17 stacked in sequence. The model Group_13 includes a first metallization layer M1 and a second metallization layer M2 over the first metallization layer M1. The model Group_14 includes a third metallization layer M3 over the second metallization layer M2 and a fourth metallization layer M4 over the third metallization layer M3. The model Group_15 includes a fifth metallization layer M5 over the fourth metallization layer M4 and a sixth metallization layer M6 over the fifth metallization layer M5. The model Group_16 includes only a seventh metallization layer M7 over the sixth metallization layer M6, and the model Group_17 includes only an eighth metallization layer M8 over the seventh metallization layer M7.

The metallization layers M1-M8 include horizontal interconnects, such as metal lines 1011-1018 extending horizontally or laterally, and respective vertical interconnects, such as metal vias 1021-1028 respectively extending vertically. The metal lines 1011, 1013, 1015, 1017 extend along a first direction (e.g., the X direction as illustrated in perspective view of FIG. 10A) and are spaced apart from each other along a second direction (e.g., the Y direction as illustrated in perspective view of FIG. 10A). The metal lines 1012, 1014, 1016, 1018 extend along the second direction (Y direction as illustrated in FIG. 10A) and are spaced apart from each other along the first direction (X direction as illustrated in FIG. 10A). As a result, longitudinal directions of the metal lines 1011, 1013, 1015, 1017 are perpendicular to longitudinal directions of the metal lines 1012, 1014, 1016, 1018.

The metal lines 1011, 1013, 1015, 1017 have corresponding line widths W101, W103, W105, W107 measured in the Y direction and line heights H101, H103, H105, H107 measured in the Z direction, and are arranged at corresponding line-to-line spacings S101, S103, S105, S107 measured in the Y direction. The metal lines 1012, 1014, 1016, 1018 have corresponding line widths W102, W104, W106, W108 measured in the X direction and line heights H102, H104, H106, H108 measured in the Z direction, and are arranged at corresponding line-to-line spacings S102, S104, S106, S108 measured in the X direction. By way of example and not limitation, the line widths of metal lines 1011-1018 may satisfy the relation W103=W105=W108<W104=W107<W101=W102=W106, the line-to-line spacings of metal lines 1011-1018 may satisfy the relation S103=S105=S108<S104=S107<S101=S102=S106, and the line heights of metal lines 1011-1018 may satisfy the relation H103=H105=H108=H104=H107<H101=H102=H106 or H103=H105=H108<H104=H107<H101=H102=H106.

FIG. 10C is a cross-sectional view of an IC structure 1000A fabricated using the layout 1000 according to some embodiments of the present disclosure, and thus the IC structure 1000A inherits geometries of those patterns in the layout 1000, as described in greater detail below. The IC structure 1000A can be fabricated in fab at the stage 122 of the fabrication flow 100 as illustrated FIG. 1. The IC structure 1000A is a non-limiting example for facilitating the illustration of the present disclosure.

The IC structure 1000A includes a device 1002A which may be a FinFET including a fin 1003A protruding from substrate 1001A and having lower portions laterally surrounded by STI regions 1005A, source/drain regions 1004A formed in the fin 1003A, a HKMG gate structure 1006A laterally between the source/drain regions 1004A, and gate spacers 1007A on opposite sidewalls of the gate structure 1006A. Example materials and fabrication of the substrate 1001A, the fin 1003A, the source/drain regions 1004A, the STI region 1005A, the gate structure 1006A and the gate spacers 1007A are similar to that of the FinFET 302A as discussed previously with respect to FIG. 3C, and thus are not repeated for the sake of brevity.

The IC structure 1000A further includes an ILD layer 1041A over the FinFETs 1002A, and contacts 1008A extending through the ILD layer 1041A to land on gate structures 1006A and/or source/drain regions 1004A of the FinFEts 1002A. Exemplary materials and fabrication of the ILD layer 1041A and the contacts 1008A are similar to that of the ILD layer 341A and contacts 308A as discussed previously with respect to FIG. 3C, and thus are not repeated for the sake of brevity.

The IC structure 1000A further includes an interconnect structure 1030A including multiple metallization layers M1A-M8A fabricated using the layout patterns of metallization layers M1-M8 of the layout 1000 as illustrated in FIG. 10A, and thus the metallization layers M1A-M8A inherit geometries of the layout patterns of the metallization layers M1-M8 in the layout 1000. The metallization layers M1A-M8A include IMD layers 1051A-1058A and 1061A-1068A, respectively. The IMD layers 1061A-1068A are formed over the corresponding IMD layers 1051A-1058A. The metallization layers M1A-M8A include horizontal interconnects, such as metal lines 1011A-1018A, respectively extending horizontally or laterally in the IMD layers 1061A-1068A and vertical interconnects, such as metal vias 1021A-1028A, respectively extending vertically in the IMD layers 1051A-1058A. Example materials and fabrication of the metallization layers M1A-M8A of the IC structure 1000A are similar to that of the IC structure 300A as discussed previously with respect to FIG. 3C, and thus are not repeated for the sake of brevity. The metal lines 1011A-1018A and metal vias 1021A-1028A have the same geometries as the corresponding metal lines 1011-1018 and metal vias 1021-1028 in the layout 1000, and thus are not repeated for the sake of brevity.

Figure 11:
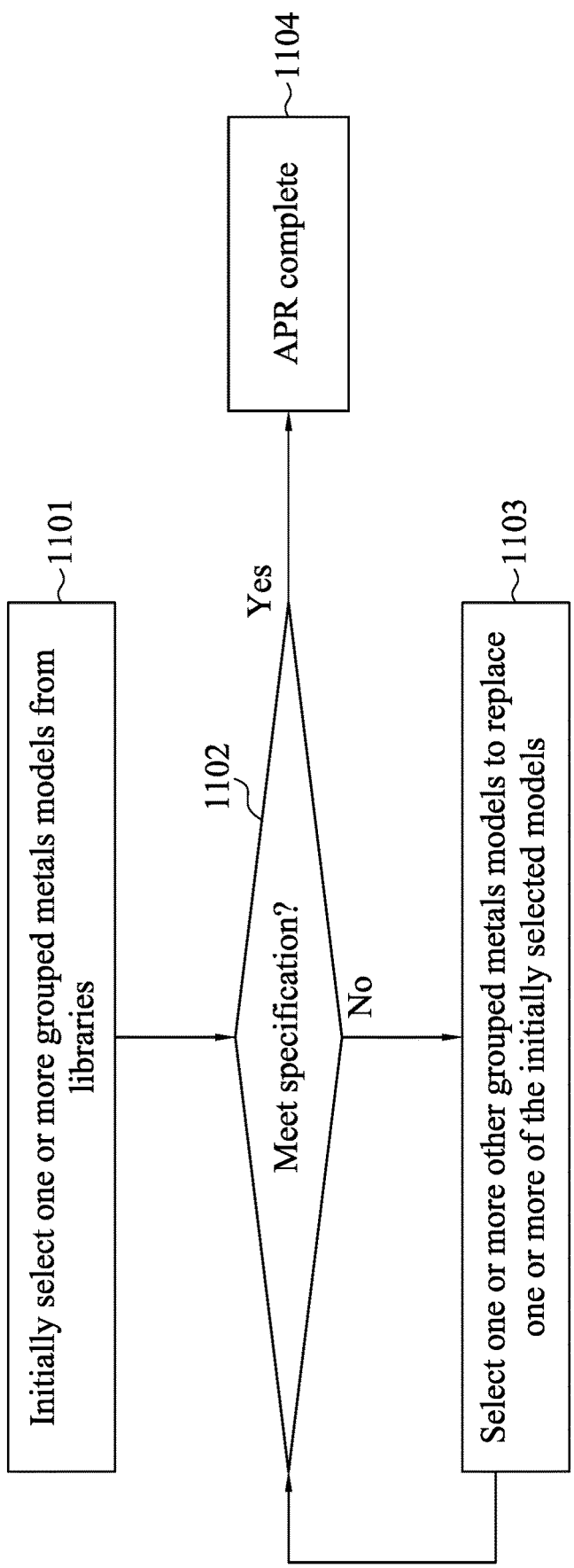
FIG. 11 is a flowchart illustrating a part of an APR function in accordance with some embodiments of the present disclosure.

FIG. 11 is a flowchart illustrating a part of an APR function in accordance with some embodiments of the present disclosure. In operation 1101, one or more models of grouped metallization layers are initially selected from the libraries 208 (as shown in FIG. 2) and placed in a layout. By way of example and not limitation, the models Group_1 and Group_2 are selected and placed in a layout to build a layout 300 as illustrated in FIG. 3A.

In operation 1102, the layout generated from operation 1101 is examined to determine whether the layout meets eligible electrical properties (e.g., parasitic resistance and capacitance), manufacturing criteria and/or design specification. If the examination result is unfavorable, the APR function proceeds to operation 1103 to select one or more other models from the libraries 208 to replace the initially selected models. By way of example and not limitation, the initially selected models Group_1 and Group_2 can be replaced with the models Group_3, Group_4 and Group_5, thus resulting a layout 500 as illustrated in FIG. 5A. Then, the rebuilt layout generated from the operation 1103 is examined again in the operation 1102. If the examination result is acceptable, the APR function is then complete in operation 1104, and a placed-and-routed layout is thus generated.

Figure 12:
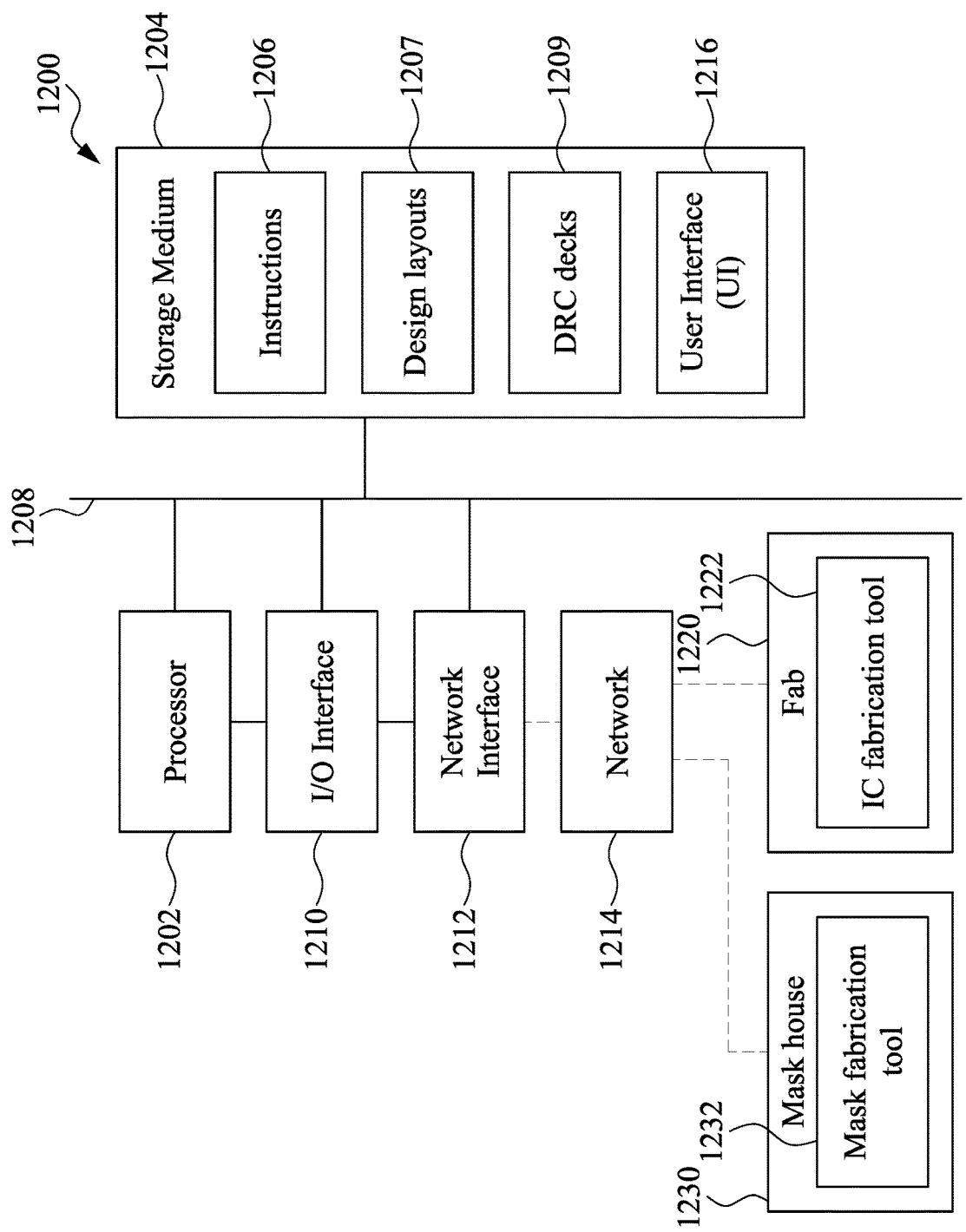
FIG. 12 is a schematic diagram of an electronic design automation (EDA) system in accordance with some embodiments of the present disclosure.

FIG. 12 is a schematic diagram of an electronic design automation (EDA) system 1200, in accordance with some embodiments. Methods described herein of generating design layouts, e.g., layouts 300, 400, 500, 600, 700, 800, 900 and/or 1000, in accordance with one or more embodiments, are implementable, for example, using EDA system 1200, in accordance with some embodiments. In some embodiments, EDA system 1200 is a general purpose computing device including a hardware processor 1202 and a non-transitory, computer-readable storage medium 1204. Computer-readable storage medium 1204, amongst other things, is encoded with, i.e., stores, a set of executable instructions 1206, design layouts 1207, design rule check (DRC) decks 1209 or any intermediate data for executing the set of instructions. Each design layout 1207 comprises a graphical representation of an integrated chip, such as for example, a GSII file. Each DRC deck 1209 comprises a list of design rules specific to a semiconductor process chosen for fabrication of a design layout 1207. Execution of instructions 1206, design layouts 1207 and DRC decks 1209 by hardware processor 1202 represents (at least in part) an EDA tool which implements a portion or all of, e.g., the methods described herein in accordance with one or more (hereinafter, the noted processes and/or methods).

Processor 1202 is electrically coupled to computer-readable storage medium 1204 via a bus 1208. Processor 1202 is also electrically coupled to an I/O interface 1210 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. Processor 1202 is configured to execute instructions 1206 encoded in computer-readable storage medium 1204 in order to cause EDA system 1200 to be usable for performing a portion or all of the operation stages 102-118 of the flow 100 as illustrated in FIG. 1. For example, the processor 1202 can be configured to execute the steps such as: provide design specifications, generate a netlist of a circuit, perform pre-layout simulation, generate a design data for a layout, defining models of grouped metallization layers in libraries, perform operations of placement and routing to generate a layout, perform post-layout simulation and verify the post-layout simulation result. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, computer-readable storage medium 1204 stores instructions 1206, design layouts 1207 (e.g., layouts 300, 400, 500, 600, 700, 800, 900, and 1000 discussed previously), DRC decks 1209 configured to cause EDA system 1200 (where such execution represents (at least in part) the EDA tool) to be usable for performing a portion or all of the noted processes and/or methods. In one or more embodiments, storage medium 1204 also stores information which facilitates performing a portion or all of all of the operation stages 102-118 of the flow 100 as illustrated in FIG. 1. For example, the storage medium 1204 may store the models of grouped metallization layers (e.g., Models Group_1-Group_17 as discussed previously) that is used in the APR operation.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows EDA system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-131212. In one or more embodiments, a portion or all of noted processes and/or methods, is implemented in two or more EDA systems 1200.

EDA system 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a user interface (UI) 1216 through I/O interface 1210. The information is stored in computer-readable medium 1204 as UI 1216.

In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Also illustrated in FIG. 12 is a mask house 1230 that receives a verified layout generated from the EDA system 1200 by, for example, the network 1214. The mask house 1230 has a mask fabrication tool 1232 (e.g., a mask writer) for fabricating one or more photomasks (e.g., photomasks used for fabricating e.g., ICs 300A, 400A, 500A, 600A, 700A, 800A, 900A and/or 1000A) based on the verified layout generated from the EDA system 1200. An IC fabricator ("Fab") 1220 may be connected to the mask house 1230 and the EDA system 1200 by, for example, the network 1214. Fab 1220 includes an IC fabrication tool 1222 for fabricating IC chips (e.g., ICs 300A, 400A, 500A, 600A, 700A, 800A, 900A and/or 1000A) using the photomasks fabricated by the mask house 1230. By way of example and not limitation, the IC fabrication tool 1222 may be a cluster tool for fabricating IC chips. The cluster tool may be a multiple reaction chamber type composite equipment which includes a polyhedral transfer chamber with a wafer handling robot inserted at the center thereof, a plurality of process chambers (e.g., CVD chamber, PVD chamber, etching chamber, annealing chamber or the like) positioned at each wall face of the polyhedral transfer chamber; and a loadlock chamber installed at a different wall face of the transfer chamber.

In some embodiments, two or more of the EDA system 1200, the mask house 1230 and the FAB 1220 are owned by a single company. For example, two or more of the EDA system 1200, the mask house 1230 and the FAB 1220 coexist in a common facility and use common resources. In some other embodiments, the EDA system 1200 is owned by a design house, which is a different entity than the mask house 1230 and the FAB 1220. In such embodiments, each of the mask house 1230, the FAB 1220 and the design house owning the EDA system 1200 interacts with one or more of the other entities and provides services to and/or receives services from one or more of the other entities.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that, with the grouped metallization layers, router can use thicker metal lines on a lower metallization layer to reduce the net resistance, thus reducing the signal delay. Another advantage is that the clock tree synthesis may place less buffers in an IC layout because reduced signal delay, which in turn results in less buffers in a final IC chip, which in turn allows for further scaling down the chip area.

In some embodiments, an IC structure includes first, second, third and fourth transistors, a first metallization layer and a second metallization layer. The first, second, third and fourth transistors are formed on a substrate. The first metallization layer is above the first, second, third and fourth transistors. The first metallization layer has a plurality of first metal lines extending laterally along a first direction and having a first line width measured in a second direction perpendicular to the first direction. One or more of the plurality of first metal lines are part of a first net electrically connecting the first transistor and the second transistor. The second metallization layer is over the first metallization layer. The second metallization layer having a plurality of second metal lines extending laterally along the second direction and having a second line width measured in the first direction. The second line width of the second metal lines is less than the first line width of the first metal lines. One or more of the plurality of second metal lines are part of a second net electrically connecting the third transistor and the fourth transistor, and a total length of the second net is less than a total length of the first net.

In some embodiments, an IC structure includes first, second, third and fourth transistors, a first metallization layer and a second metallization layer. The first metallization layer is above the first, second, third and fourth transistors. The first metallization layer includes a plurality of first metal lines extending laterally along a first direction and arranged at a first line-to-line spacing. One or more of the plurality of first metal lines are part of a first net electrically connecting the first transistor and the second transistor. The second metallization layer is over the first metallization layer. The second metallization layer includes a plurality of second metal lines extending laterally along a second direction perpendicular to the first direction and arranged at a second line-to-line spacing. The first line-to-line spacing is greater than the second line-to-line spacing. One or more of the plurality of second metal lines are part of a second net connecting the third transistor and the fourth transistor, and a total length of the second net is less than a total length of the first net.

In some embodiments, a method includes storing a plurality of models of grouped metallization layers in a storage medium; placing, in a layout, a first one of the plurality of models of grouped metallization layers over devices; placing, in the layout, a second one of the plurality of models of grouped metallization layers over the first one of the plurality of models of grouped metallization layers, wherein a bottommost metallization layer of the second one of the plurality of models of grouped metallization layers has a smaller metal line width than a topmost metallization layer of the first one of the plurality of models of grouped metallization layers; routing a first net at least in part on the topmost metallization layer of the first one of the plurality of models of grouped metallization layers; routing a second net at least in part on the bottommost metallization layer of the second one of the plurality of models of grouped metallization layers; and fabricating an integrated circuit based on the layout. The second net has a total length shorter than a total length of the first net.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
a first transistor, a second transistor, a third transistor and a fourth transistor formed on a substrate;
a first net electrically connecting the first transistor and the second transistor, the first net comprising a plurality of first metal lines routed on a first metallization layer, and a plurality of first metal vias electrically connecting the plurality of first metal lines to the first and second transistors; and
a second net electrically connecting the third transistor and the fourth transistor, the second net comprising a plurality of second metal lines routed on a second metallization layer, and a plurality of second metal vias electrically connecting the plurality of second metal lines to the third and fourth transistors, wherein a count of the plurality of first metal vias of the first net is less than a count of the plurality of second metal vias of the second net, and a line height of each of the plurality of first metal lines of the first net is greater than a line height of each of the plurality of second metal lines of the second net.

2. The IC structure of claim 1, wherein the second metallization layer is above the first metallization layer.

3. The IC structure of claim 1, further comprising:
a plurality of third metal lines below the plurality of first metal lines, wherein a line height of each of the plurality of third metal lines is greater than the line height of each of the plurality of second metal lines of the second net.

4. The IC structure of claim 3, wherein the line height of each of the plurality of third metal lines is equal to the line height of each of the plurality of first metal lines of the first net.

5. The IC structure of claim 1, further comprising:
a plurality of fourth metal lines above the plurality of second metal liens, wherein a line height of each of the plurality of fourth metal lines is greater than the line height of each of the plurality of second metal lines of the second net.

6. The IC structure of claim 5, wherein the line height of each of the plurality of fourth metal lines is equal to the line height of each of the plurality of first metal lines of the first net.

7. The IC structure of claim 6, wherein a line width of each of the plurality of fourth metal lines is less than a line width of each of the plurality of first metal lines of the first net.

8. The IC structure of claim 7, wherein the line width of each of the plurality of fourth metal lines is greater than a line width of each of the plurality of second metal lines of the second net.

9. An IC structure, comprising:
a first transistor, a second transistor, a third transistor and a fourth transistor formed on a substrate;
a first net electrically connecting the first transistor and the second transistor, the first net comprising a plurality of first metal lines routed on a first metallization layer, and a plurality of first metal vias electrically connecting the plurality of first metal lines to the first and second transistors; and
a second net electrically connecting the third transistor and the fourth transistor, the second net comprising a plurality of second metal lines routed on a second metallization layer, and a plurality of second metal vias electrically connecting the plurality of second metal lines to the third and fourth transistors, wherein a count of the plurality of first metal vias of the first net is less than a count of the plurality of second metal vias of the second net, and a line-to-line spacing between adjacent two of the plurality of first metal lines of the first net is greater than a line-to-line spacing between adjacent two of the plurality of second metal lines of the second net.

10. The IC structure of claim 9, further comprising:
a plurality of third metal lines below the plurality of first metal lines, wherein a line-to-line spacing between adjacent two of the plurality of third metal lines is less than the line-to-line spacing between adjacent two of the plurality of first metal lines of the first net.

11. The IC structure of claim 10, wherein the line-to-line spacing between adjacent two of the plurality of third metal lines is greater than the line-to-line spacing between adjacent two of the plurality of second metal lines of the second net.

12. The IC structure of claim 9, further comprising:
a plurality of fourth metal lines above the plurality of second metal lines, wherein a line-to-line spacing between adjacent two of the plurality of fourth metal lines is less than the line-to-line spacing between adjacent two of the plurality of first metal lines of the first net.

13. The IC structure of claim 12, wherein the line-to-line spacing between adjacent two of the plurality of fourth metal lines is greater than the line-to-line spacing between adjacent two of the plurality of second metal lines of the second net.

14. The IC structure of claim 12, wherein a line width of each of the plurality of fourth metal lines is less than a line width of the plurality of first metal lines of the first net.

15. The IC structure of claim 14, wherein the line width of each of the plurality of fourth metal lines is greater than a line width of the plurality of second metal lines of the second net.

16. An IC structure, comprising:
a first transistor, a second transistor, a third transistor and a fourth transistor formed on a substrate;
a first net electrically connecting the first transistor and the second transistor, the first net comprising a plurality of first metal lines routed on a first metallization layer, and a plurality of first metal vias electrically connecting the plurality of first metal lines to the first and second transistors; and
a second net electrically connecting the third transistor and the fourth transistor, the second net comprising a plurality of second metal lines routed on a second metallization layer above the plurality of first metal lines, and a plurality of second metal vias electrically connecting the plurality of second metal lines to the third and fourth transistors, wherein a count of the plurality of first metal vias of the first net is less than a count of the plurality of second metal vias of the second net, and a total length of the plurality of first metal lines of the first net is longer than a total length of the plurality of second metal lines of the second net.

17. The IC structure of claim 16, wherein a line width of each of the plurality of first metal lines of the first net is greater than a line width of each of the plurality of second metal lines of the second net.

18. The IC structure of claim 16, wherein a line height of each of the plurality of first metal lines of the first net is greater than a line height of each of the plurality of second metal lines of the second net.

19. The IC structure of claim 16, wherein a distance between adjacent ones of the plurality of first metal lines of the first net is greater than a distance between adjacent ones of the plurality of second metal lines of the second net.

20. The IC structure of claim 16, wherein the second metallization layer is a next layer to the first metallization layer.

* * * * *